(12) United States Patent
Kim et al.

(10) Patent No.: US 11,309,645 B2
(45) Date of Patent: Apr. 19, 2022

(54) ELECTRONIC DEVICE INCLUDING FLEXIBLE PRINTED CIRCUIT BOARD

(71) Applicant: Samsung Electronics Co., Ltd., Suwon-si (KR)

(72) Inventors: Minki Kim, Suwon-si (KR); Byunghoon Lee, Suwon-si (KR); Min Park, Suwon-si (KR); Sungtae Park, Suwon-si (KR); Jungmin Park, Suwon-si (KR); Yongjae Song, Suwon-si (KR); Hongshin Shin, Suwon-si (KR); Woosung Jang, Suwon-si (KR); Chulwoo Park, Suwon-si (KR); Chihyun Cho, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 17/061,461

(22) Filed: Oct. 1, 2020

(65) Prior Publication Data
US 2021/0098911 A1   Apr. 1, 2021

(30) Foreign Application Priority Data

Oct. 1, 2019 (KR) .......................... 10-2019-0121614

(51) Int. Cl.
*H05K 5/00* (2006.01)
*H01R 12/62* (2011.01)
*H05K 1/14* (2006.01)

(52) U.S. Cl.
CPC ............. *H01R 12/62* (2013.01); *H05K 1/147* (2013.01)

(58) Field of Classification Search
CPC ......... H05K 2201/05; H05K 2201/051; H05K 2201/052; H05K 2201/053;
(Continued)

(56) References Cited

U.S. PATENT DOCUMENTS 6,664,874 B2  12/2003 Shirasaki
2006/0007059 A1*  1/2006 Bell .................. G06F 1/163
345/55
(Continued)

FOREIGN PATENT DOCUMENTS

JP   H09-174236 A   7/1997
JP   2004356413 A   12/2004
(Continued)

OTHER PUBLICATIONS

International Search Report of the International Searching Authority in connection with International Application No. PCT/KR2020/011541 dated Dec. 4, 2020, 3 pages.

*Primary Examiner* — Binh B Tran

(57) ABSTRACT

An electronic device includes a housing; a first circuit board, and a flexible circuit board. The first circuit board is disposed in an internal space of the housing and includes a plurality of first conductive terminals. The flexible circuit board includes a first connection portion including a plurality of second conductive terminals configured to connect to the plurality of first conductive terminals. The flexible circuit board also includes a connection portion extended from the first connection portion, and at least one conductive layer extended from the connection portion to at least a portion of the first connection portion. Additionally, the flexible circuit board includes at least one transmissive area in which light may be transmitted and the at least one conductive layer is at least partially omitted. At least some of the plurality of second conductive terminals are visible from the outside through the at least one transmissive area.

20 Claims, 34 Drawing Sheets

(58) Field of Classification Search
CPC ....... H05K 2201/055; H05K 2201/056; H05K 2201/057; H05K 2201/058; H05K 1/147; H05K 1/028; H05K 1/189; H01R 12/62
USPC ......................................................... 361/749
See application file for complete search history.

(56) References Cited

U.S. PATENT DOCUMENTS

| | | |
|---|---|---|
| 2009/0057378 A1 | 3/2009 | Hwang et al. |
| 2012/0319980 A1* | 12/2012 | Nagaoka .............. H05K 1/0269 345/173 |
| 2016/0088724 A1 | 3/2016 | Chuo et al. |
| 2018/0366813 A1 | 12/2018 | Kim et al. |
| 2021/0357080 A1* | 11/2021 | Lee ....................... G06F 3/0446 |

FOREIGN PATENT DOCUMENTS

| | | |
|---|---|---|
| JP | 2005-340641 A | 12/2005 |
| JP | 4984465 B2 | 7/2012 |
| JP | 2015-226311 A | 12/2015 |
| KR | 10-1890700 B1 | 8/2018 |
| KR | 10-2019-0064877 A | 6/2019 |

* cited by examiner

ELECTRONIC DEVICE INCLUDING FLEXIBLE PRINTED CIRCUIT BOARD

CROSS-REFERENCE TO RELATED APPLICATION

This application is based on and claims priority under 35 U.S.C. § 119 to Korean Patent Application No. 10-2019-0121614 filed on Oct. 1, 2019 in the Korean Intellectual Property Office, the disclosure of which is incorporated by reference herein in its entirety.

BACKGROUND

1. Field

Various embodiments of the disclosure relate to an electronic device including a flexible circuit board.

2. Description of Related Art

The electronic device is gradually becoming slim and is being developed to increase the rigidity thereof, strengthen a design aspect thereof, and simultaneously differentiate functional elements thereof.

A plurality of electronic components disposed in an internal space of the electronic device should be efficiently disposed with each other to help slim the electronic device.

The electronic device may include electronic components spaced apart a predetermined distance in order to minimize interference or influence between each other in the internal space. These electronic components may be electrically connected through a flexible circuit board having a predetermined length. For example, these electronic components may include a printed circuit board disposed in the internal space of the electronic device, and various electrical elements electrically connected to the printed circuit board through a flexible circuit board. The electrical elements may include, for example, an antenna structure, various sensor modules, a camera module, a key input module, a speaker module, or a microphone module.

Recently, in order to electrically connect the printed circuit board and the flexible circuit board, a plurality of conductive terminals of the flexible circuit board may be disposed to correspond to the plurality of conductive terminals of the printed circuit board, and then be electrically connected to the plurality of conductive terminals through soldering. In order to accommodate the increasingly diverse functions of electronic devices, the number of a plurality of soldered terminals is gradually increasing, but there is a limit to increase the size for slimming of the electronic device, and smaller terminals having a fine pitch between terminals may be applied.

However, when disposing miniaturized terminals having a fine pitch of the flexible circuit board at corresponding terminals of the printed circuit board, it may not be easy to dispose the terminals.

When communication is performed by high-speed communication (e.g., 5G communication method) using miniaturized terminals having a fine pitch, shielding of a junction is weak; thus, interference or noise may occur. According to one embodiment, an opaque layer (e.g., conductive layer or metal layer) may be formed to prevent interference that may occur at the junction. When the printed circuit board is bonded by an opaque layer formed on the terminal of the flexible circuit board, it is difficult to view the corresponding terminals from the outside; thus, accurate alignment between the terminals may be difficult. This may lead to poor connection. Moreover, a new connection method for precise electrical connection between miniaturized terminals having a fine pitch may be required.

SUMMARY

Various embodiments of the disclosure may provide an electronic device including a flexible circuit board.

Various embodiments of the disclosure may provide an electronic device including a flexible circuit board having an alignment structure that enables precise alignment between a plurality of terminals.

According to various embodiments of the disclosure, an electronic device includes a housing; a first circuit board disposed in an internal space of the housing and including a plurality of first conductive terminals; and a flexible circuit board including a first connection portion including a plurality of second conductive terminals configured to connect to the plurality of first conductive terminals, a extending portion extended from the first connection portion, and at least one conductive layer extended from the extending portion to at least a portion of the first connection portion, wherein the flexible circuit board includes at least one transmissive area in which light may be transmitted and in which the at least one conductive layer is at least partially omitted, and at least some of the plurality of second conductive terminals are disposed to be visible from the outside through the at least one transmissive area.

According to various embodiments of the disclosure, an electronic device includes a housing; a first printed circuit board disposed in an internal space of the housing and including a plurality of first conductive terminals; a second printed circuit board spaced apart from the first printed circuit board; and a flexible circuit board including a connection portion configured to electrically connect the first printed circuit board and the second printed circuit board and including a plurality of second conductive terminals, wherein the connecting portion includes at least one transmissive area formed to check at least some of the plurality of first conductive terminals and at least some of the plurality of second conductive terminals from the outside, when at least some of the plurality of first conductive terminals and at least some of the plurality of second conductive terminals overlap each other to be electrically connected.

According to various embodiments of the disclosure, an electronic device includes a first circuit board in which at least one antenna is disposed; a second circuit board in which communication circuits configured to process signals to be transmitted to or received from an external electronic device through the at least one antenna are disposed; and a flexible circuit board connected between the first circuit board and the second circuit board, wherein the flexible circuit board includes a third conductive layer including a first ground plane electrically connected to a ground of the communication circuit; a first conductive layer including a second ground plane electrically connected to the ground; a second conductive layer disposed between the third conductive layer and the first conductive layer and including a signal wiring electrically connected between the at least one antenna and the communication circuit; and a connection portion in which at least a portion of the signal wiring is formed with a plurality of conductive terminals electrically connected to the first circuit board through a conductive adhesive member, wherein the third conductive layer includes a shielding area facing the connection portion and extended from the first ground plane and a transmissive area in which light may be transmitted.

Before undertaking the DETAILED DESCRIPTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely.

Moreover, various functions described below can be implemented or supported by one or more computer programs, each of which is formed from computer readable program code and embodied in a computer readable medium. The terms "application" and "program" refer to one or more computer programs, software components, sets of instructions, procedures, functions, objects, classes, instances, related data, or a portion thereof adapted for implementation in a suitable computer readable program code. The phrase "computer readable program code" includes any type of computer code, including source code, object code, and executable code. The phrase "computer readable medium" includes any type of medium capable of being accessed by a computer, such as read only memory (ROM), random access memory (RAM), a hard disk drive, a compact disc (CD), a digital video disc (DVD), or any other type of memory. A "non-transitory" computer readable medium excludes wired, wireless, optical, or other communication links that transport transitory electrical or other signals. A non-transitory computer readable medium includes media where data can be permanently stored and media where data can be stored and later overwritten, such as a rewritable optical disc or an erasable memory device.

Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present disclosure and its advantages, reference is now made to the following description taken in conjunction with the accompanying drawings, in which like reference numerals represent like parts.

DETAILED DESCRIPTION

FIGS. 1 through 15B, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged system or device.

The following description with reference to the accompanying drawings is provided to assist in a comprehensive understanding of various embodiments of the disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the disclosure. In addition, descriptions of well-known functions and constructions may be omitted for clarity and conciseness.

The terms and words used in the following description and claims are not limited to the bibliographical meanings, but are merely used to enable a clear and consistent understanding of the disclosure. Accordingly, it should be apparent to those skilled in the art that the following description of various embodiments of the disclosure is provided for illustration purpose only and not for the purpose of limiting the disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

FIGS. 1 to 11C, discussed below, and the various embodiments used to describe the principles of the disclosure in this patent document are by way of illustration only and should not be construed in any way to limit the scope of the disclosure. Those skilled in the art will understand that the principles of the disclosure may be implemented in any suitably arranged system or device.

Hereinafter, embodiments of the disclosure are described in detail with reference to accompanying drawings.

Figure 1:
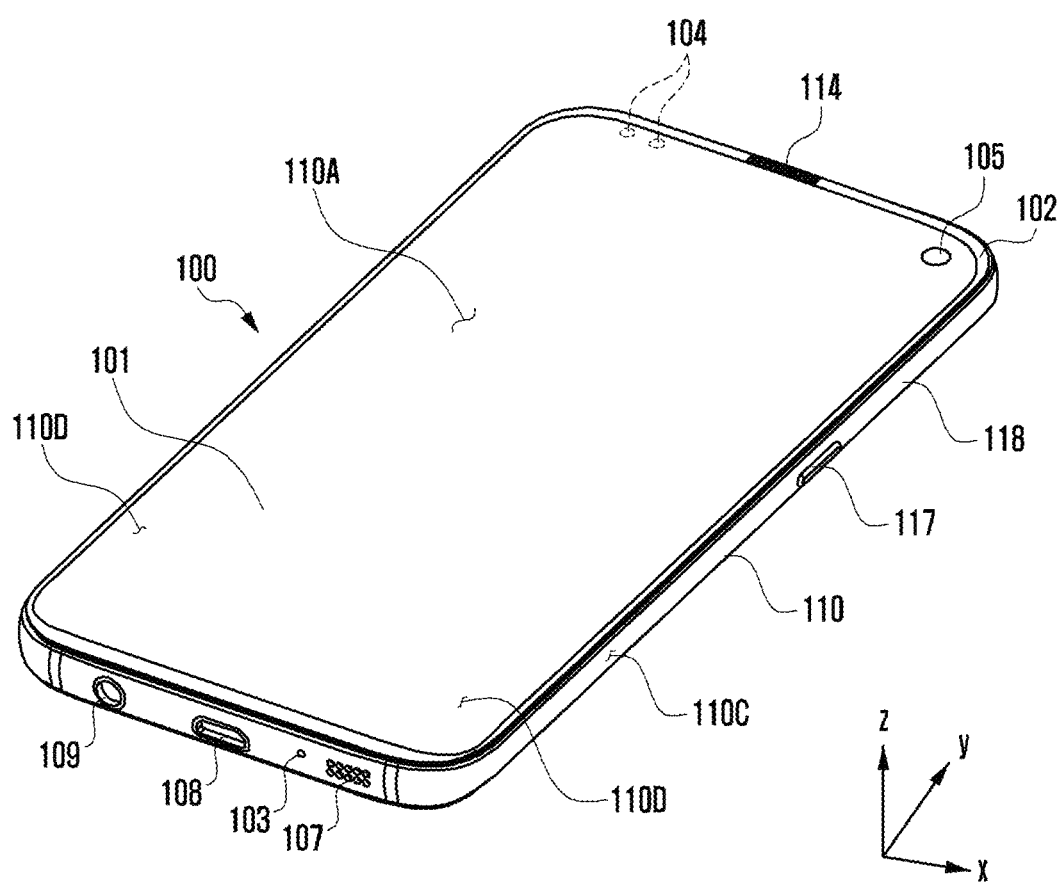
FIG. 1 illustrates a perspective view of a front surface of a mobile electronic device according to various embodiments of the disclosure.
Figure 2:
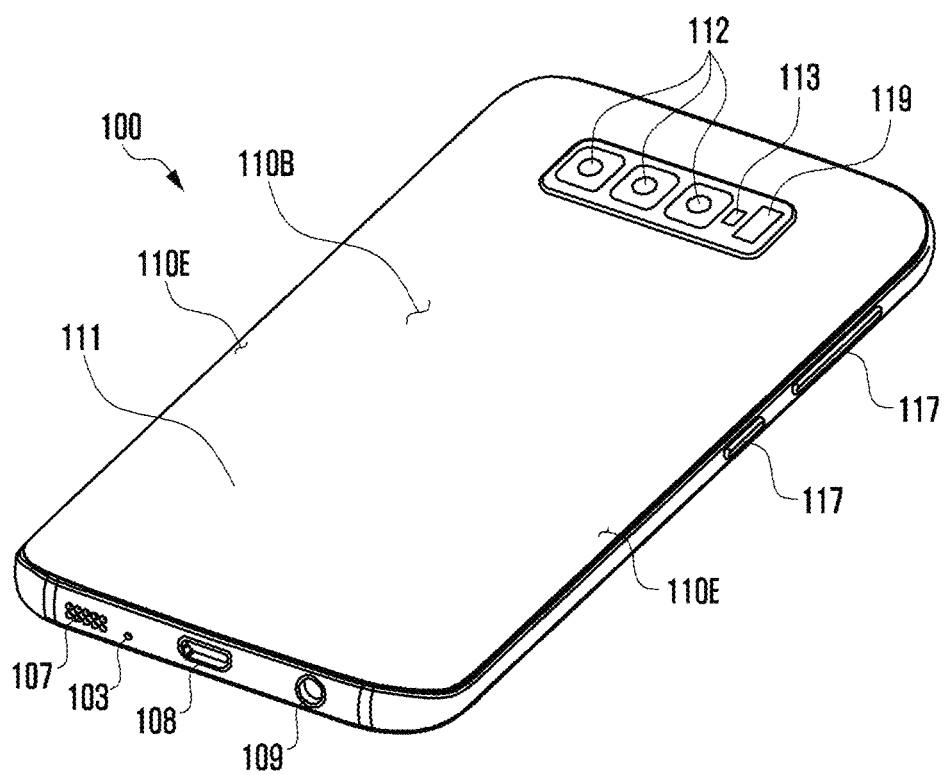
FIG. 2 illustrates a perspective view of a rear surface of the electronic device of FIG. 1 according to various embodiments of the disclosure.

FIG. 1 illustrates a perspective view showing a front surface of a mobile electronic device according to an embodiment of the disclosure, and FIG. 2 illustrates a perspective view showing a rear surface of the mobile electronic device shown in FIG. 1 according to an embodiment of the disclosure.

Referring to FIGS. 1 and 2, a mobile electronic device 100 may include a housing 110 that includes a first surface (or front surface) 110A, a second surface (or rear surface) 110B, and a lateral surface 110C that surrounds a space between the first surface 110A and the second surface 110B. The housing 110 may refer to a structure that forms a part of the first surface 110A, the second surface 110B, and the lateral surface 110C. The first surface 110A may be formed of a front plate 102 (e.g., a glass plate or polymer plate coated with a variety of coating layers) at least a part of which is substantially transparent. The second surface 110B may be formed of a rear plate 111 which is substantially opaque. The rear plate 111 may be formed of, for example, coated or colored glass, ceramic, polymer, metal (e.g., aluminum, stainless steel (STS), or magnesium), or any combination thereof. The lateral surface 110C may be formed of a lateral bezel structure (or "lateral member") 118 which is combined with the front plate 102 and the rear plate 111 and includes a metal and/or polymer. The rear plate 111 and the lateral bezel structure 118 may be integrally formed and may be of the same material (e.g., a metallic material such as aluminum).

The front plate 102 may include two first regions 110D disposed at long edges thereof, respectively, and bent and extended seamlessly from the first surface 110A toward the rear plate 111. Similarly, the rear plate 111 may include two second regions 110E disposed at long edges thereof, respectively, and bent and extended seamlessly from the second surface 110B toward the front plate 102. The front plate 102 (or the rear plate 111) may include only one of the first regions 110D (or of the second regions 110E). The first regions 110D or the second regions 110E may be omitted in part. When viewed from a lateral side of the mobile electronic device 100, the lateral bezel structure 118 may have a first thickness (or width) on a lateral side where the first region 110D or the second region 110E is not included, and may have a second thickness, being less than the first thickness, on another lateral side where the first region 110D or the second region 110E is included.

The mobile electronic device 100 may include at least one of a display 101, audio modules 103, 107 and 114, sensor modules 104 and 119, camera modules 105, 112 and 113, a key input device 117, a light emitting device, and connector holes 108 and 109. The mobile electronic device 100 may omit at least one (e.g., the key input device 117 or the light emitting device) of the above components, or may further include other components.

The display 101 may be exposed through a substantial portion of the front plate 102, for example. At least a part of the display 101 may be exposed through the front plate 102 that forms the first surface 110A and the first region 110D of the lateral surface 110C. Outlines (i.e., edges and corners) of the display 101 may have substantially the same form as those of the front plate 102. The spacing between the outline of the display 101 and the outline of the front plate 102 may be substantially unchanged in order to enlarge the exposed area of the display 101.

A recess or opening may be formed in a portion of a display area of the display 101 to accommodate at least one of the audio module 114, the sensor module 104, the camera module 105, and the light emitting device. At least one of the audio module 114, the sensor module 104, the camera module 105, a fingerprint sensor (not shown), and the light emitting element may be disposed on the back of the display area of the display 101. The display 101 may be combined with, or adjacent to, a touch sensing circuit, a pressure sensor capable of measuring the touch strength (pressure), and/or a digitizer for detecting a stylus pen. At least a part of the sensor modules 104 and 119 and/or at least a part of the key input device 117 may be disposed in the first region 110D and/or the second region 110E.

The audio modules 103, 107 and 114 may correspond to a microphone hole 103 and speaker holes 107 and 114, respectively. The microphone hole 103 may contain a microphone disposed therein for acquiring external sounds and, in a case, contain a plurality of microphones to sense a sound direction. The speaker holes 107 and 114 may be classified into an external speaker hole 107 and a call receiver hole 114. The microphone hole 103 and the speaker holes 107 and 114 may be implemented as a single hole, or a speaker (e.g., a piezo speaker) may be provided without the speaker holes 107 and 114.

The sensor modules 104 and 119 may generate electrical signals or data corresponding to an internal operating state of the mobile electronic device 100 or to an external environmental condition. The sensor modules 104 and 119 may include a first sensor module 104 (e.g., a proximity sensor) and/or a second sensor module (e.g., a fingerprint sensor) disposed on the first surface 110A of the housing 110, and/or a third sensor module 119 (e.g., a heart rate monitor (HRM) sensor) and/or a fourth sensor module (e.g., a fingerprint sensor) disposed on the second surface 110B of the housing 110. The fingerprint sensor may be disposed on the second surface 110B as well as the first surface 110A (e.g., the display 101) of the housing 110. The electronic device 100 may further include at least one of a gesture sensor, a gyro sensor, an air pressure sensor, a magnetic sensor, an acceleration sensor, a grip sensor, a color sensor, an infrared (IR) sensor, a biometric sensor, a temperature sensor, a humidity sensor, or an illuminance sensor.

The camera modules 105, 112 and 113 may include a first camera device 105 disposed on the first surface 110A of the electronic device 100, and a second camera device 112 and/or a flash 113 disposed on the second surface 110B. The camera module 105 or the camera module 112 may include one or more lenses, an image sensor, and/or an image signal processor. The flash 113 may include, for example, a light emitting diode or a xenon lamp. Two or more lenses (infrared cameras, wide angle and telephoto lenses) and image sensors may be disposed on one side of the electronic device 100.

The key input device 117 may be disposed on the lateral surface 110C of the housing 110. The mobile electronic device 100 may not include some or all of the key input device 117 described above, and the key input device 117 which is not included may be implemented in another form such as a soft key on the display 101. The key input device 117 may include the sensor module disposed on the second surface 110B of the housing 110.

The light emitting device may be disposed on the first surface 110A of the housing 110. For example, the light emitting device may provide status information of the electronic device 100 in an optical form. The light emitting device may provide a light source associated with the operation of the camera module 105. The light emitting device may include, for example, a light emitting diode (LED), an IR LED, or a xenon lamp.

The connector holes 108 and 109 may include a first connector hole 108 adapted for a connector (e.g., a universal serial bus (USB) connector) for transmitting and receiving power and/or data to and from an external electronic device, and/or a second connector hole 109 adapted for a connector (e.g., an earphone jack) for transmitting and receiving an audio signal to and from an external electronic device.

Some sensor modules 104 and 119 of camera modules 105 and 212, or an indicator may be arranged to be exposed through a display 101. For example, the camera module 105, the sensor module 104, or the indicator may be arranged in the internal space of an electronic device 100 so as to be brought into contact with an external environment through an opening of the display 101, which is perforated up to a front plate 102. In another embodiment, some sensor modules 104 may be arranged to perform their functions without being visually exposed through the front plate 102 in the internal space of the electronic device. For example, in this case, an area of the display 101 facing the sensor module may not require a perforated opening.

Figure 3:
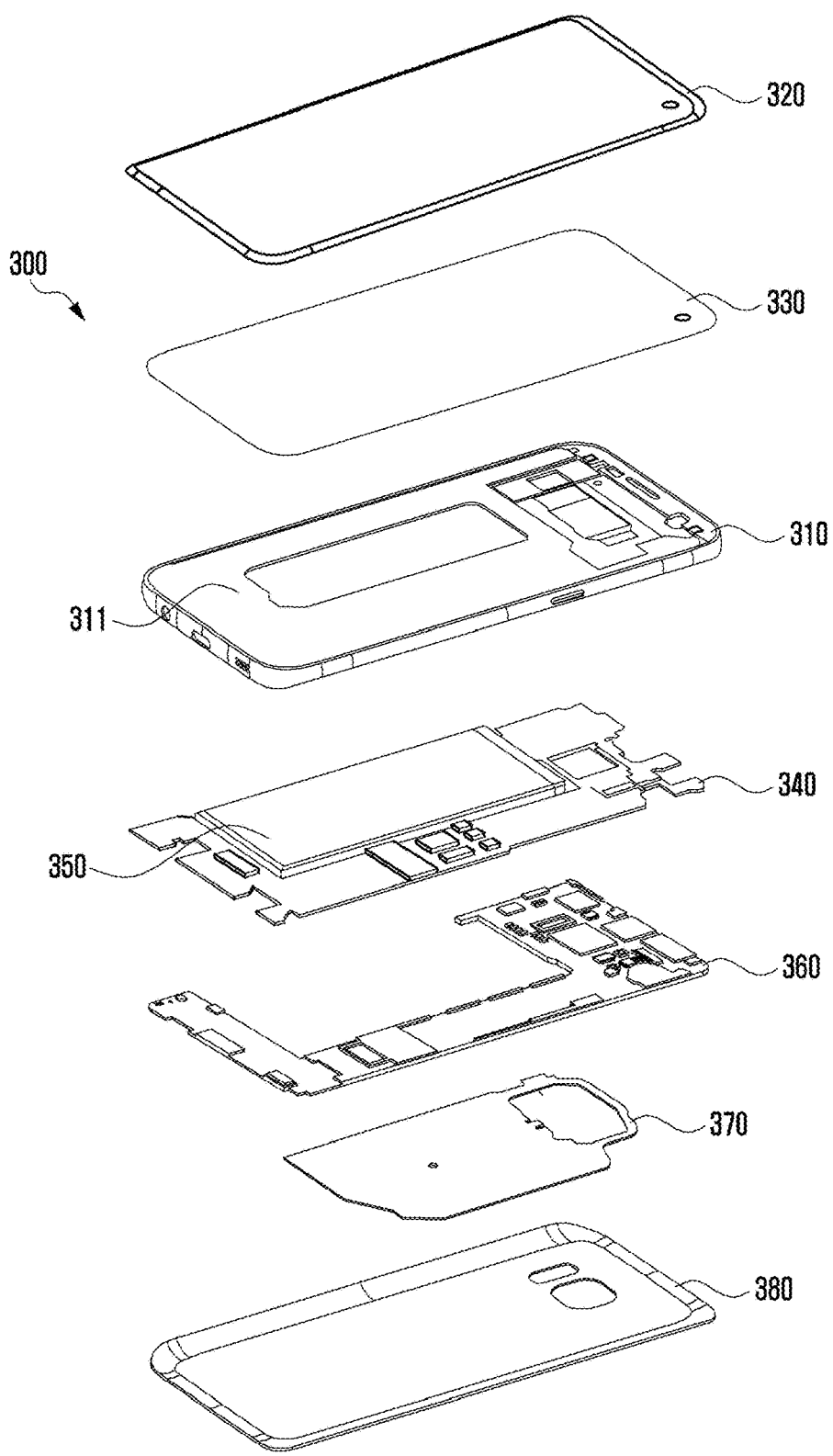
FIG. 3 illustrates an exploded perspective view of the electronic device of FIG. 1 according to various embodiments of the disclosure.

FIG. 3 illustrates an exploded perspective view showing a mobile electronic device shown in FIG. 1 according to an embodiment of the disclosure.

Referring to FIG. 3, a mobile electronic device 300 may include a lateral bezel structure 310, a first support member 311 (e.g., a bracket), a front plate 320, a display 330, an electromagnetic induction panel (not shown), a printed circuit board (PCB) 340, a battery 350, a second support member 360 (e.g., a rear case), an antenna 370, and a rear plate 380. The mobile electronic device 300 may omit at least one (e.g., the first support member 311 or the second support member 360) of the above components or may further include another component. Some components of the electronic device 300 may be the same as or similar to those of the mobile electronic device 100 shown in FIG. 1 or FIG. 2, thus, descriptions thereof are omitted below.

The first support member 311 is disposed inside the mobile electronic device 300 and may be connected to, or integrated with, the lateral bezel structure 310. The first support member 311 may be formed of, for example, a metallic material and/or a non-metal (e.g., polymer) material. The first support member 311 may be combined with the display 330 at one side thereof and also combined with the printed circuit board (PCB) 340 at the other side thereof. On the PCB 340, a processor, a memory, and/or an interface may be mounted. The processor may include, for example, one or more of a central processing unit (CPU), an application processor (AP), a graphics processing unit (GPU), an image signal processor (ISP), a sensor hub processor, or a communications processor (CP).

The memory may include, for example, one or more of a volatile memory and a non-volatile memory.

The interface may include, for example, a high definition multimedia interface (HDMI), a USB interface, a secure digital (SD) card interface, and/or an audio interface. The interface may electrically or physically connect the mobile electronic device 300 with an external electronic device and may include a USB connector, an SD card/multimedia card (MMC) connector, or an audio connector.

The battery 350 is a device for supplying power to at least one component of the mobile electronic device 300, and may include, for example, a non-rechargeable primary battery, a rechargeable secondary battery, or a fuel cell. At least a part of the battery 350 may be disposed on substantially the same plane as the PCB 340. The battery 350 may be integrally disposed within the mobile electronic device 300, and may be detachably disposed from the mobile electronic device 300.

The antenna 370 may be disposed between the rear plate 380 and the battery 350. The antenna 370 may include, for example, a near field communication (NFC) antenna, a wireless charging antenna, and/or a magnetic secure transmission (MST) antenna. The antenna 370 may perform short-range communication with an external device, or transmit and receive power required for charging wirelessly. An antenna structure may be formed by a part or combination of the lateral bezel structure 310 and/or the first support member 311.

Figure 4:
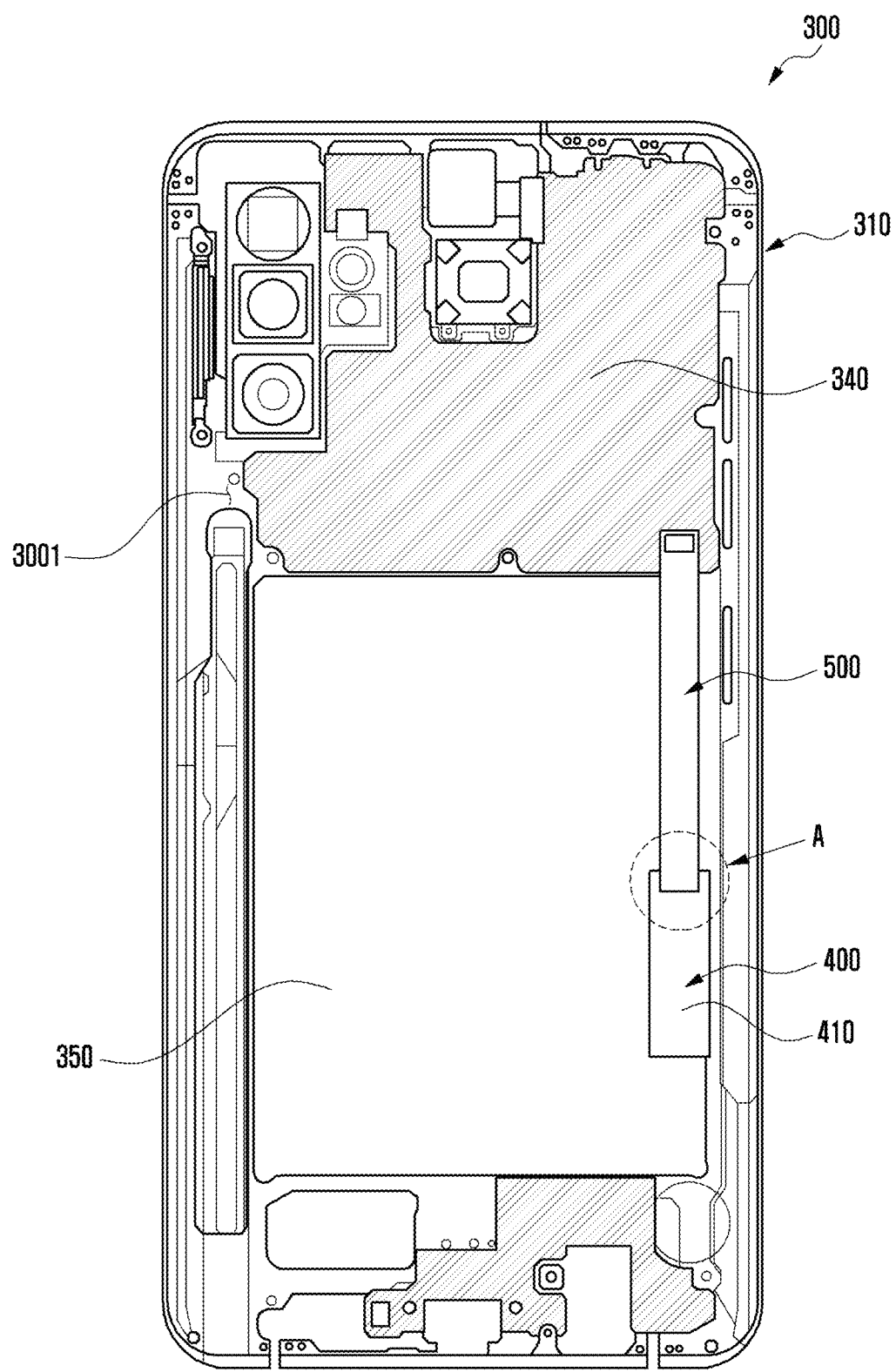
FIG. 4 illustrates a diagram of an internal configuration of an electronic device including a flexible circuit board according to various embodiments of the disclosure.

FIG. 4 illustrates a diagram of an internal configuration of an electronic device 300 including a flexible circuit board 500 according to various embodiments of the disclosure.

The electronic device 300 of FIG. 4 may be at least partially similar to the electronic device 100 of FIG. 1 or may further include other components of the electronic device.

Referring to FIG. 4, the electronic device 300 may include a front cover (e.g., the front plate 320 of FIG. 3) facing a first direction (e.g., the z-axis direction of FIG. 1), a rear cover (e.g., the rear plate 380 of FIG. 3) facing a second direction (e.g., −z axis direction of FIG. 1) opposite to the front plate 320, and a housing structure (e.g., the housing 110 of FIG. 1) including a side member (such as the lateral bezel structure 310) enclosing an internal space 3001 between the front plate 320 and the rear plate 380.

According to various embodiments, the electronic device 300 may include a PCB 340 disposed in at least a partial area of the internal space 3001. According to one embodiment, the PCB 340 may be disposed in an area (e.g., an upper area of the electronic device) in which main electronic components (at least one camera device, at least one sensor or speaker device) disposed in the internal space of the electronic device 300 are densely disposed. According to an embodiment, the electronic device 300 may include an antenna structure 400 disposed at a position spaced apart from the PCB 340. According to an embodiment, the electronic device 300 may include a flexible circuit board 500 that electrically connects the PCB 340 and the antenna structure 400 in the internal space 3001. According to an embodiment, the electronic device 300 may include a wireless communication circuit (not illustrated) disposed at the PCB 340. According to one embodiment, the wireless communication circuit may be configured to transmit and/or receive radio signals based on frequencies of various bands through the antenna structure 400 electrically connected by the flexible circuit board 500. For example, the antenna structure 400 may be configured to transmit and/or receive radio signals based on frequencies in an ultra-wideband frequency band (range of about 3 GHz to 100 GHz). In another embodiment, the wireless communication circuit may be configured to transmit and/or receive radio signals in the range of about 800 MHz to 3000 MHz through the antenna structure 400 electrically connected by the flexible circuit board 500. In another embodiment, the antenna structure may use at least a portion of the side member 310 as an antenna structure. For example, at least a portion of the side member (such as the lateral bezel structure 310) may be segmented by a non-conductive portion, and the conductive portion may serve as an antenna.

According to various embodiments, the flexible circuit board 500 may include a flexible printed circuit board (FPCB) type RF cable (FRC) including at least one electrical wiring and for transferring radio signals of at least one antenna element (e.g., an antenna element 420 of FIG. 5) disposed at the antenna structure 400 to the PCB 340. According to one embodiment, unlike a conventional coaxial RF cable, the FRC may be made of a polyimide material that is resistant to bending and easy to expand a function. According to an embodiment, when the electronic device 300 is viewed from the outside, the flexible circuit board 500 may be disposed at a position overlapped at least partially with at least one electronic component in the internal space 3001 of the electronic device 300. According to an embodiment, at least one electronic component may include a battery 350.

Figure 5:
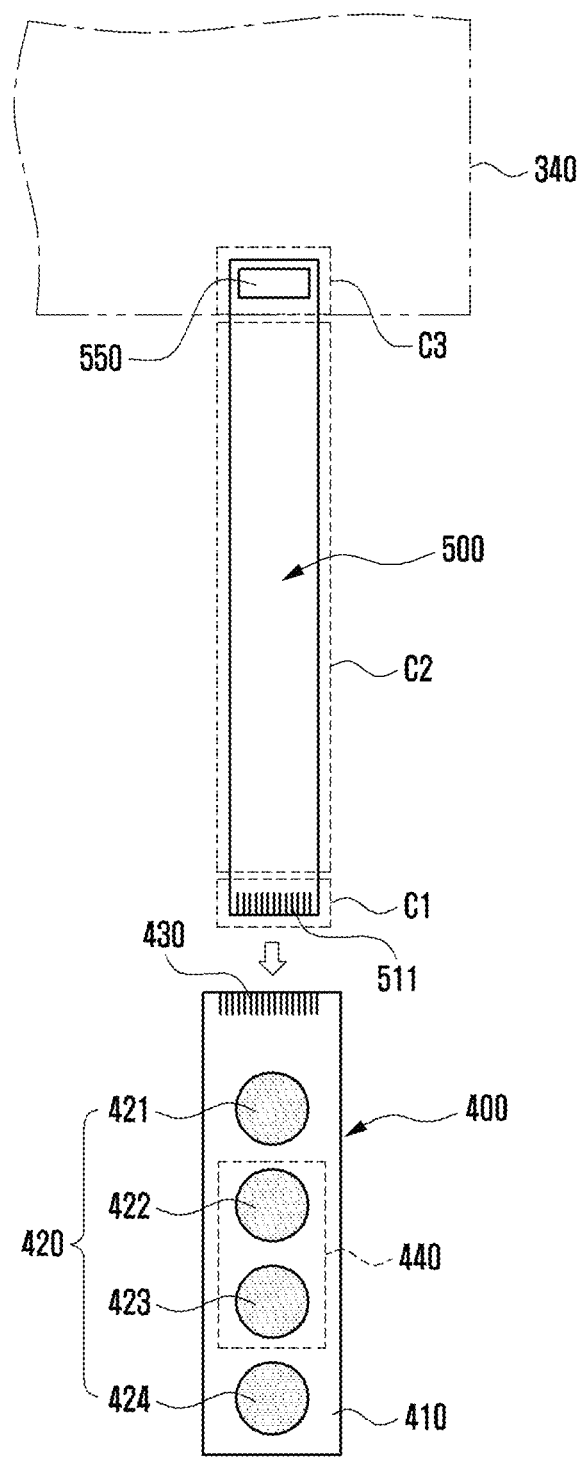
FIG. 5 illustrates a diagram of a state in which two printed circuit boards are connected through a flexible circuit board according to various embodiments of the disclosure.

According to various embodiments, the antenna structure 400 may include a printed circuit board 410 including at least one antenna element (e.g., the antenna element 420 of FIG. 5). According to an embodiment, in the electronic device 300, in order to transfer a signal between a plurality of conductive terminals (e.g., a plurality of first conductive terminals 430 and a plurality of second conductive terminals 511 of FIG. 5) in an area (area A) in which the flexible circuit board 500 and the printed circuit board 410 are electrically connected, the terminals may be bonded to correspond to each other. In this case, the terminals may have an alignment structure of a precisely aligned form so as to be electrically connected to each other. According to one embodiment, the plurality of conductive terminals may be disposed to have a fine pitch in the range of about 0.2 mm to 0.65 mm. In another embodiment, the alignment structure according to the embodiment of the disclosure may also be applied to a portion in which the PCB 340 and the flexible circuit board 500 are electrically connected.

According to various embodiments, the antenna structure 400 may form a beam pattern in a direction in which a rear cover (e.g., the rear plate 111 of FIG. 2) of the electronic device 300 faces and/or a direction in which the side member (such as the lateral bezel structure 310) faces according to a disposition structure of the printed circuit board 410.

FIG. 5 illustrates a state in which two printed circuit boards (e.g., the PCB 340 and the printed circuit board 410 of the antenna structure 400) are connected through the flexible circuit board 500 according to various embodiments of the disclosure.

Referring to FIG. 5, the flexible circuit board 500 may include a first connection portion C1 electrically connected to the antenna structure 400, a extending portion C2 extended in a predetermined length from the first connection portion C1, and a second connection portion C3 extended from the extending portion C2. According to an embodiment, the extending portion C2 may include an electrical connector 550 for being electrically connected to a receptacle disposed at the PCB 340. In another embodiment, a connection structure between the second connection portion C3 and the PCB 340 may be substantially the same as that between the first connection portion C1 and the printed circuit board 410 of the antenna structure 400.

According to various embodiments, the antenna structure 400 may include a printed circuit board 410 (e.g., dielectric substrate), and at least one antenna element 420 disposed at the printed circuit board 410. According to an embodiment, the at least one antenna element 420 may include a plurality of conductive patches 421, 422, 423, and 424 (e.g., array patch antenna) exposed at an outer surface of the printed circuit board 410 or embedded at a position close to an outer surface inside the printed circuit board 410. According to an embodiment, the at least one antenna element 420 may include conductive patterns (e.g., array dipole antenna) embedded inside the printed circuit board 410. In another embodiment, the at least one antenna element 420 may include all of the above-described plurality of conductive patches 421, 422, 423, and 424 and a plurality of conductive patterns. According to an embodiment, the antenna structure 400 may include a wireless communication circuit 440 disposed at the printed circuit board 410.

According to various embodiments, the antenna structure 400 may include a plurality of first conductive terminals 430 disposed at the printed circuit board 410. According to one embodiment, the plurality of first conductive terminals 430 may be exposed at least partially at an outer surface of the printed circuit board 410. According to an embodiment, the flexible circuit board 500 may include a plurality of second conductive terminals 511 to be electrically connected to each of the plurality of first conductive terminals 430. According to an embodiment, the plurality of second conductive terminals 511 may also be disposed to be exposed at least partially at an outer surface in the first connection portion C1 of the flexible circuit board 500. Accordingly, the flexible circuit board 500 may be electrically connected by being fixed to the printed circuit board 410 through conductive bonding (e.g., a conductive bonding 610 of FIGS. 6A-6D) in a state in which the plurality of second conductive terminals 511 are aligned to face each other to the plurality of first conductive terminals 430 of the printed circuit board 410.

FIGS. 6A-6D illustrate diagrams of a process in which the flexible circuit board 500 is electrically connected to the printed circuit board 410 through the conductive bonding 610 according to various embodiments of the disclosure.

Figure 6A:
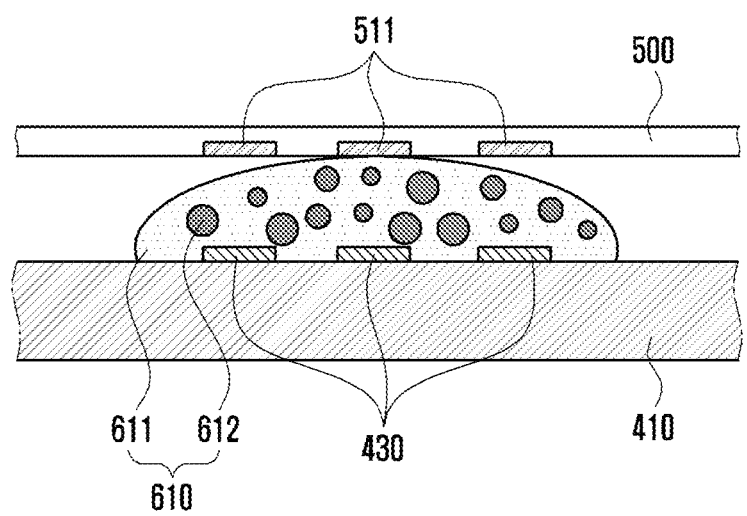
FIGS. 6A-6D illustrate diagrams of a process in which a flexible circuit board is electrically connected to a printed circuit board through conductive bonding according to various embodiments of the disclosure.

Referring to FIG. 6A, the conductive bonding 610 may be applied to an upper portion of the plurality of first conductive terminals 430 disposed on the printed circuit board 410. In this case, the conductive bonding 610 may be provided in a liquid form in which fine conductive particles 612 are mixed with a curable liquid resin 611. In another embodiment, solid state resin particles may be further included in the liquid resin 611. According to one embodiment, the flexible circuit board 500 may be disposed on the applied conductive bonding 610. According to an embodiment, the flexible circuit board 500 may be disposed such that the plurality of second conductive terminals 511 face and align with the plurality of first conductive terminals 430.

Figure 6B:
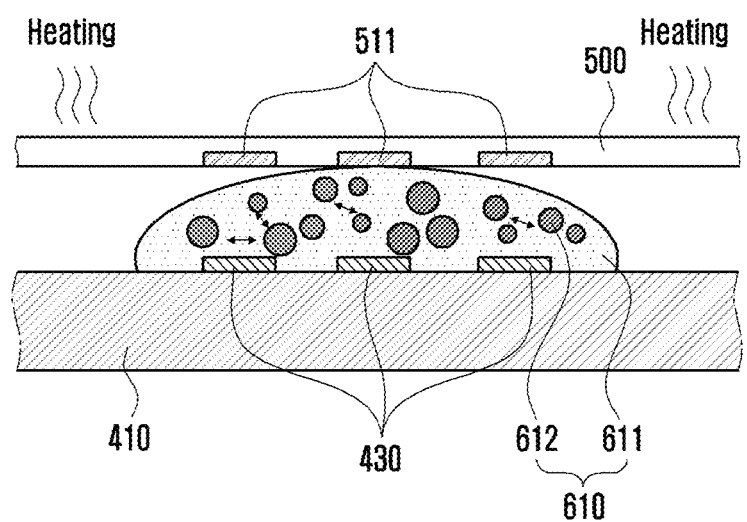

According to various embodiments, in FIG. 6B, while the flexible circuit board 500 is heated to a predetermined temperature through a heating device such as a hot bar at an upper portion thereof, the flexible circuit board 500 may be pressed in a direction of the printed circuit board 410. Although not illustrated, a buffer member for closely contacting a first connection portion (the first connection portion C1 of FIG. 5) of the flexible circuit board 500 and the printed circuit board 410 while simultaneously satisfying a heat transfer characteristic and a heat resistance characteristic may be further interposed between a heated metal portion of the heating device and the flexible circuit board 500. The buffer member may include silicone-based rubber.

Figure 6C:
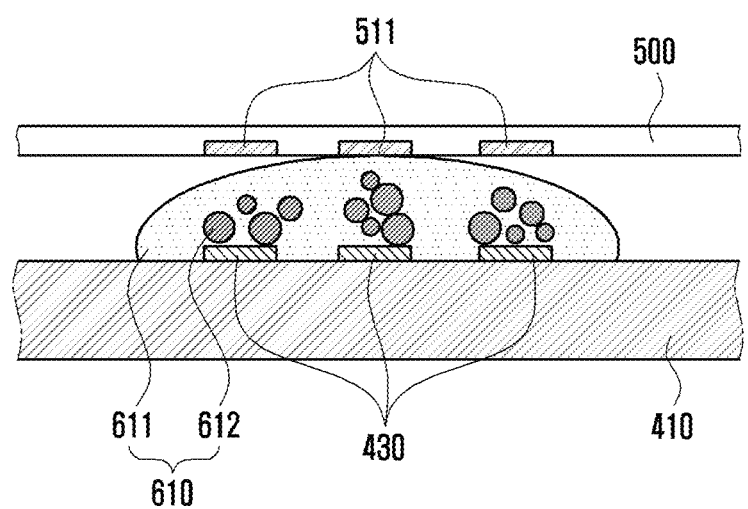

According to various embodiments, in FIG. 6C, when being heated for a predetermined time to a predetermined temperature, the fine conductive particles 612 evenly spread at a liquid resin of the conductive bonding 610 may be concentrated in the vicinity of a plurality of conductive terminals (e.g., the plurality of first conductive terminals 430 and the plurality of second conductive terminals 511).

Figure 6D:
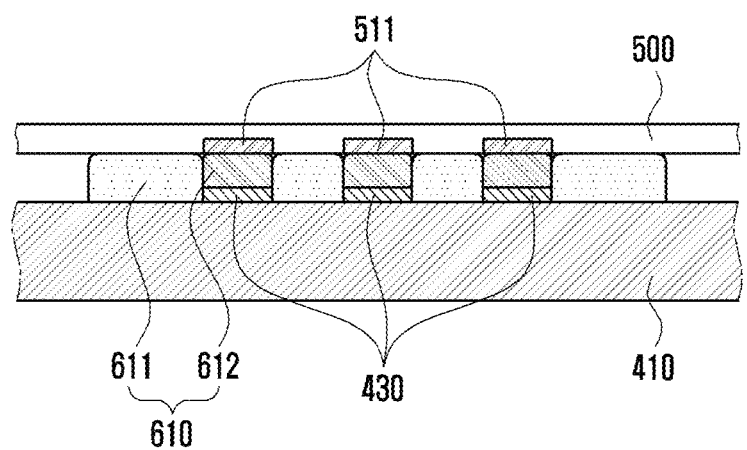

According to an embodiment, the fine conductive particles may be configured with a core and a conductive film, the core may be configured with Ni (nickel) and plastic, and the conductive film may be configured with Au (Gold) and Ni. According to one embodiment, a separate insulating film may be formed outside the conductive particles. A liquid resin of the conductive bonding may include a performance of conductivity, insulation, and adhesiveness. By acting on the plurality of first conductive terminals 430 and the plurality of second conductive terminals 511, two portions may be adhered to each other by thermal compression. In this case, the conductive terminals may be electrically connected. In a plane direction of the conductive bonding, insulation between the circuit and the circuit may be represented. According to one embodiment, as illustrated in FIG. 6D, when a state of the conductive bonding 610 is solidified, the liquid resin 611 may attach the printed circuit board 410 and the flexible circuit board 500 to each other between a plurality of conductive terminals (e.g., the plurality of first conductive terminals 430 and the plurality second conductive terminals 511), and the fine conductive particles 612 may be concentrated in the plurality of conductive terminals (e.g., the plurality of first conductive terminals 430 and the plurality of second conductive terminals 511); thus, thus the plurality of first conductive terminals 430 and the plurality of second conductive terminals 511 may be electrically connected to each other. According to an embodiment, the conductive bonding 610 may include an anisotropic conductive adhesive (ACA) or an anisotropic conductive paste (ACP). In another embodiment, the conductive bonding 610 may be replaced with an anisotropic conductive film (ACF). In another embodiment, the conductive bonding 610 may be replaced with a solder (e.g., pre-solder) for soldering.

According to an embodiment of the disclosure, for alignment of the conductive terminals (e.g., the plurality of first conductive terminals 430 and the plurality of second conductive terminals 511), when viewed from above the printed circuit board 410, if the conductive terminals are at least partially overlapped, the flexible circuit board 500 may include at least one transmissive area in which the plurality of first printed circuit boards of the printed circuit board 410 may be visible through at least a portion of the first connection portion (e.g., the first connection portion C1 of FIG. 5). According to one embodiment, the transmissive area may be formed through the transparent or translucent insulating material (e.g., an insulating material 501 of FIG. 7B) disposed with at least one conductive layer (e.g., ground) removed in the first connection portion C1.

Hereinafter, in the drawings, various types of transmissive areas disposed at the flexible circuit board 500 will be described in detail.

Figure 7A:
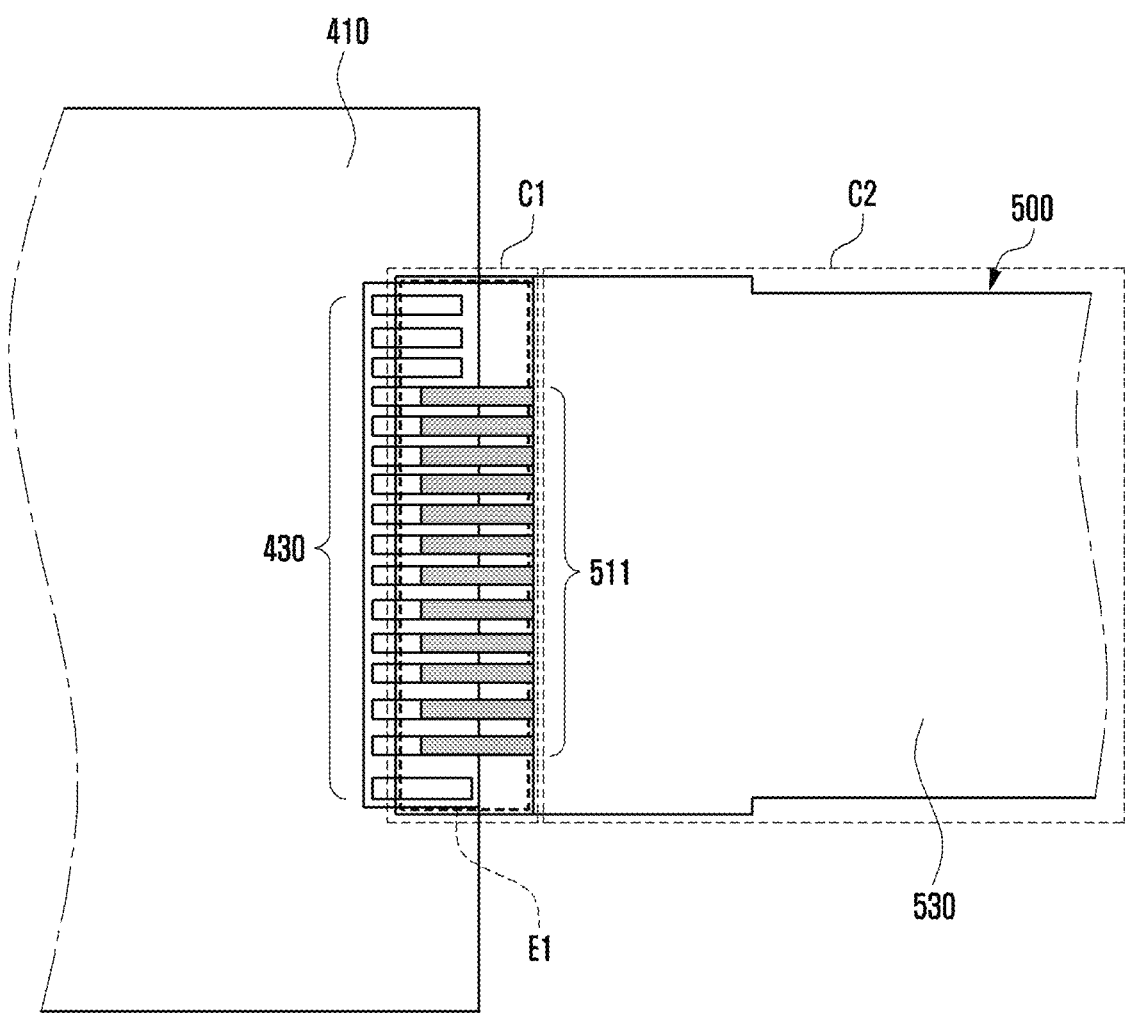
FIG. 7A illustrates a partial plan view of a state in which a flexible circuit board is aligned with a printed circuit board according to various embodiments of the disclosure.
Figure 7B:
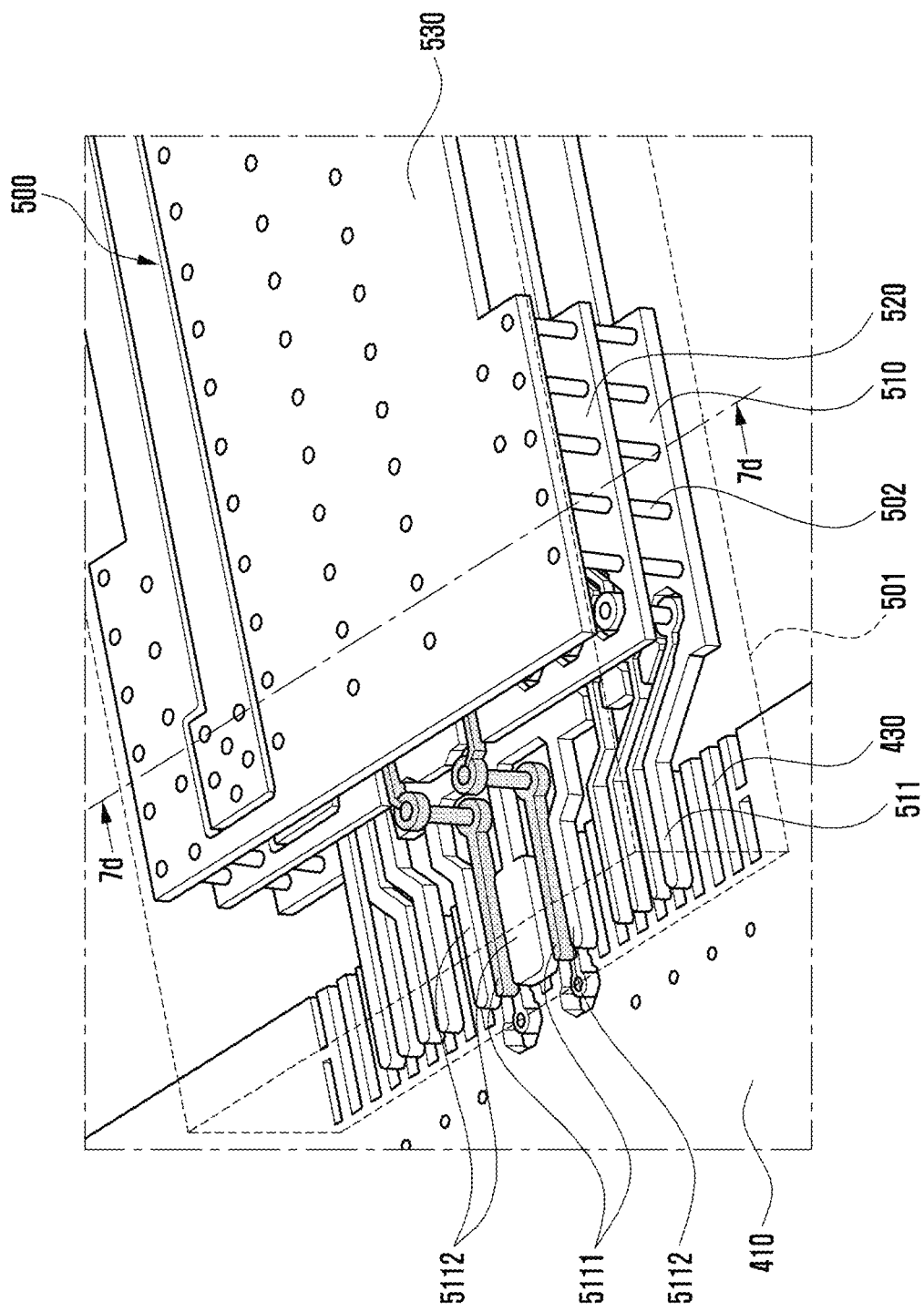
FIG. 7B illustrates a partial perspective view of a state in which a flexible circuit board is aligned with a printed circuit board according to various embodiments of the disclosure.
Figure 7C:
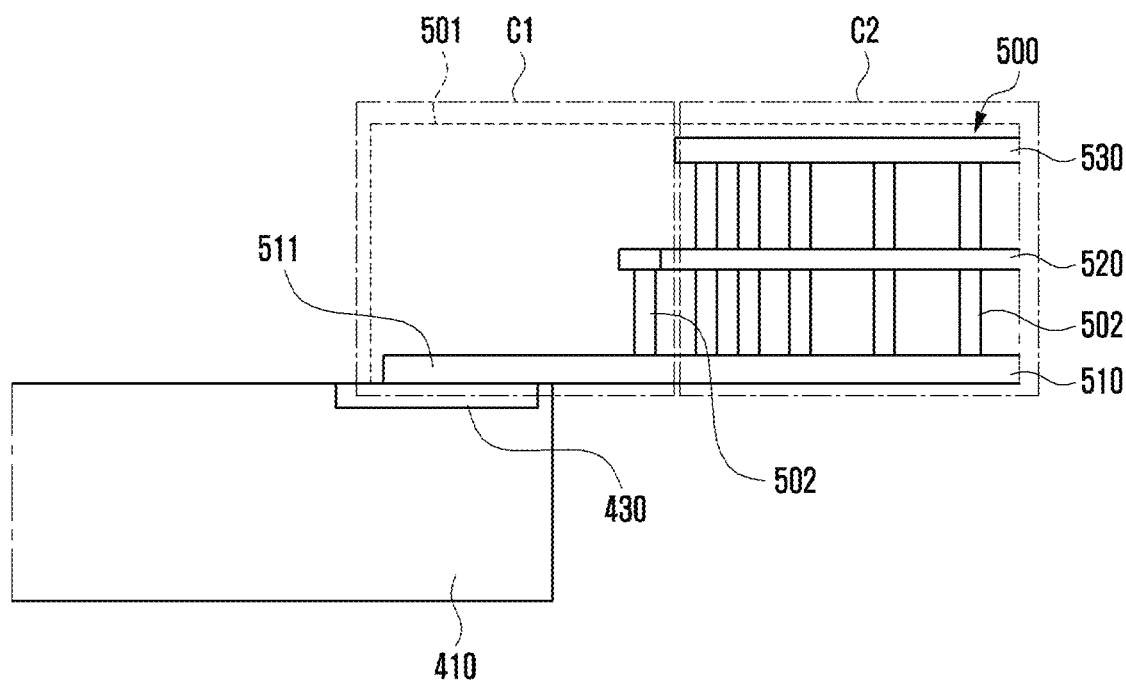
FIG. 7C illustrates a partial cross-sectional view of a state in which a flexible circuit board is aligned with a printed circuit board according to various embodiments of the disclosure.

FIG. 7A illustrates a partial plan view of a state in which a flexible circuit board 500 is aligned with a printed circuit board 410 according to various embodiments of the disclosure, FIG. 7B illustrates a partial perspective view of a state in which a flexible circuit board 500 is aligned with a printed circuit board 410 according to various embodiments of the disclosure, and FIG. 7C illustrates a partial cross-sectional view of a state in which a flexible circuit board 500 is aligned with a printed circuit board 410 according to various embodiments of the disclosure.

Referring to FIGS. 7A to 7C, the flexible circuit board 500 may include a first connection portion C1 and a extending portion C2 extended in a predetermined length from the first connection portion C1. According to one embodiment, when viewed from above the printed circuit board 410, in the flexible circuit board 500, at least a portion of the first connection portion C1 may be disposed at a position overlapped with at least a portion of the printed circuit board 410. For example, in this case, the plurality of first conductive terminals 430 disposed at the printed circuit board 410 may be aligned to face the plurality of second conductive terminals 511 disposed at the first connection portion C1 of the flexible circuit board 500. According to one embodiment, when viewed from above the flexible circuit board 500, in the first connection portion C1, all of the plurality of second conductive terminals 511 may be visible through a transmissive area E1 that occupies substantially most area. According to one embodiment, the plurality of second conductive terminals 511 of the printed circuit board 410 overlapped with the first connection portion C1 may also be visible through the transmissive area E1. Therefore, when the first connection portion C1 of the flexible circuit board 500 overlaps an upper portion of the printed circuit board 410, a position of the flexible circuit board 500 or the printed circuit board 410 may be determined so that the plurality of second conductive terminals 511 of the flexible circuit board 500 is disposed to overlap the plurality of first conductive terminals 430 of the printed circuit board 410 or to correspond to the plurality of first conductive terminals 430 of the printed circuit board 410 to be electrically connected to the plurality of first conductive terminals 430 of the printed circuit board 410 through the transmissive area E1, when viewed from above the flexible circuit board 500. According to an embodiment, the plurality of second conductive terminals 511 may be accurately aligned with the plurality of first conductive terminals 430 through an alignment device (e.g., vision device).

Referring to FIGS. 7B and 7C, the flexible circuit board 500 may be formed in a multilayer structure including a plurality of conductive layers 530, 520, and 510 stacked to be insulated from each other through the insulating material 501. According to an embodiment, the flexible circuit board 500 may include a first conductive layer 510, a second conductive layer 520 stacked in an insulated state in an upper portion of the first conductive layer 510, and a third conductive layer 530 disposed in an insulated state in an upper portion of the second conductive layer 520. According to one embodiment, the first conductive layer 510 and the third conductive layer 530 may be electrically connected through a plurality of conductive vias 502 to operate as a ground area (e.g., ground plane) at the extending portion C2. According to one embodiment, the flexible circuit board 500 may include some terminals of the plurality of second conductive terminals 511 extended from the first conductive layer 510 and spaced at regular intervals in the first connection portion C1. According to an embodiment, at least some of the plurality of second conductive terminals 511 may include ground terminals 5112 extended from the first conductive layer 510. According to an embodiment, at least some of the plurality of second conductive terminals 511 may include at least one signal terminal 5111 (e.g., RF signal terminal) disposed between the ground terminals 5112 extended from the first conductive layer 510 in the first connection portion C1 and connected and disposed through the conductive via 502 in a state insulated from a ground area of the second conductive layer 520. According to one embodiment, the at least one signal terminal 5111 may be formed using at least a portion of the second conductive layer 520 and be disposed in the same layer as that of the first conductive layer 510 through the conductive via 502. According to an embodiment, through the signal terminal 5111, the electronic device may transfer a signal transmitted and received through the antenna structure 400 to at least one electronic module (e.g., a wireless communication circuit or communication unit) disposed at the PCB 340.

Figure 7D:
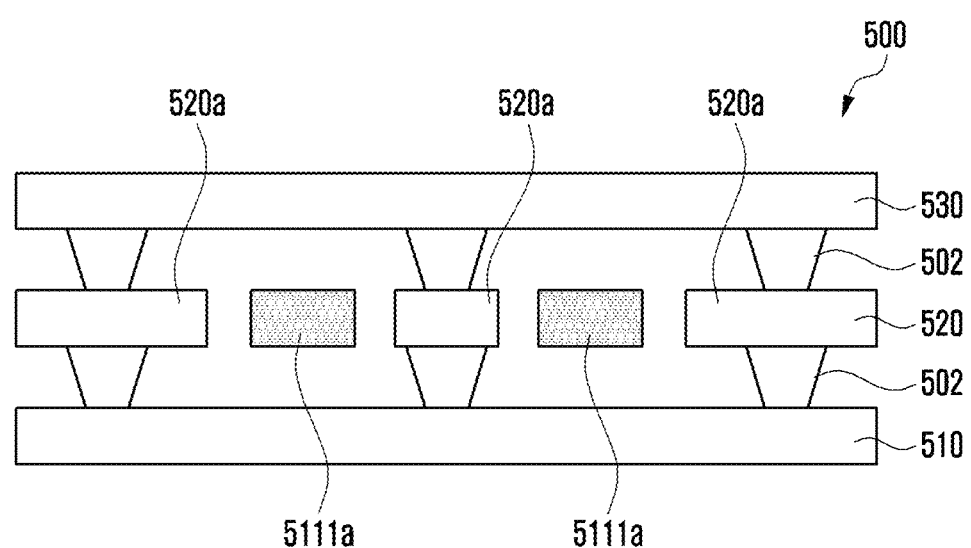
FIG. 7D illustrates a partial cross-sectional view of a flexible circuit board viewed along line 7D-7D of FIG. 7B according to various embodiments of the disclosure.
Figure 7E:
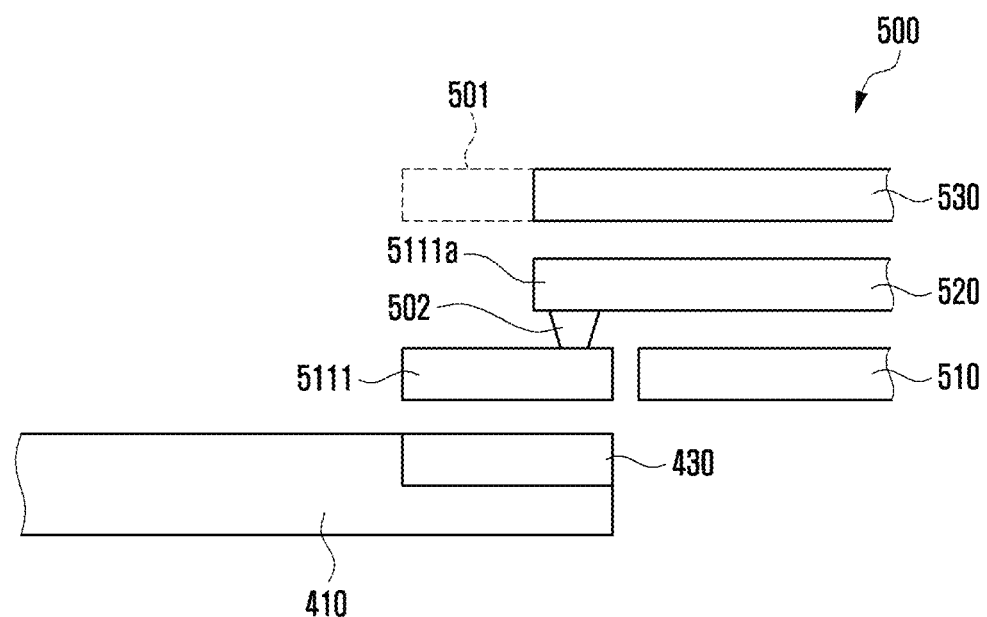
FIG. 7E illustrates a partial cross-sectional view of a structure in which a signal transfer wiring layer of a flexible circuit board is connected to a printed circuit board according to various embodiments of the disclosure.

FIG. 7D illustrates a partial cross-sectional view of a flexible circuit board 500 viewed along line 7D-7D of FIG. 7B according to various embodiments of the disclosure. FIG. 7E illustrates a partial cross-sectional view of a structure in which a signal transfer wiring layer 5111a of the flexible circuit board 500 is connected to the printed circuit board 410 according to various embodiments of the disclosure.

Referring to FIGS. 7D and 7E, the flexible circuit board 500 may include a signal transfer wiring layer 5111a disposed at least partially in the second conductive layer 520, and ground wiring layers 520a partially disposed at the left and right sides of the signal transfer wiring layer 5111a. According to one embodiment, the signal transfer wiring layer 5111a may be extended from the extending portion C2 to at least a portion of the first connection portion C1 and be electrically connected to the signal terminal (e.g., the signal terminal 5111 of FIG. 7B) disposed at a portion of the plurality of second conductivity of the first conductive layer 510 through the conductive via 502. According to one embodiment, when the flexible circuit board 500 is connected to the printed circuit board 410, the signal terminal 5111 may be electrically connected to a corresponding terminal among the plurality of first conductive terminals 430 of the printed circuit board 410.

According to an embodiment of the disclosure, because the signal transfer wiring layer 5111a is disposed in an enclosing manner through a first conductive layer 510, a second conductive layer 520, and the ground wiring layers 520a at least partially formed in the second conductive layer 520 in the extending portion (e.g., the extending portion C2 of FIG. 7A), noise can be shielded and interference with peripheral other electronic components can be prevented.

Figure 7F:
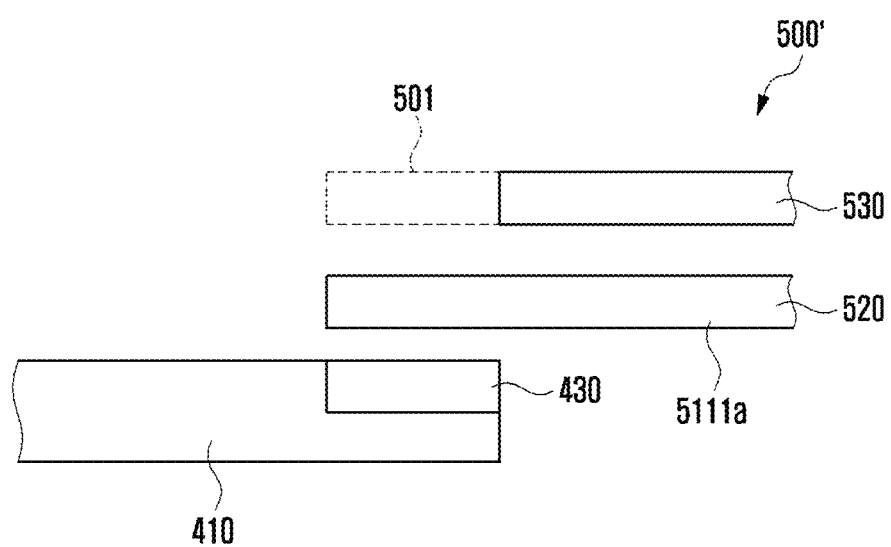
FIG. 7F illustrates a partial cross-sectional view of a structure in which a signal transfer wiring layer of a flexible circuit board is connected to a printed circuit board according to various embodiments of the disclosure.

FIG. 7F illustrates a partial cross-sectional view of a structure in which a signal transfer wiring layer 5111a of a flexible circuit board 500' is connected to the printed circuit board 410 according to various embodiments of the disclosure.

Referring to FIG. 7F, in the flexible circuit board 500', the signal transfer wiring layer 5111a disposed at least partially in the second conductive layer 520 may be directly electrically connected to a corresponding terminal among the plurality of first conductive terminals 430 of the printed circuit board 410 without a first conductive layer (e.g., the first conductive layer 510 of FIG. 7E).

According to various embodiments, the flexible circuit board 500 may include a transmissive area E1 removed through substantially an entire area and in which the second conductive layer 520 and the third conductive layer 530 correspond to an area substantially corresponding to the first connection portion C1. In this case, when viewed from above the flexible circuit board 500, the plurality of second conductive terminals 511 visible through the transmissive area E1 made of the insulating material 501 of a translucent material in the first connection portion C1 may be accurately electrically connected to the printed circuit board 410 through accurate alignment with the plurality of first conductive terminals 430 of the printed circuit board 410 visible below.

Hereinafter, in describing the flexible circuit board 500 according to similar embodiments of the disclosure, the same reference numerals are given to the same components, and detailed descriptions thereof may be omitted.

Figure 8A:
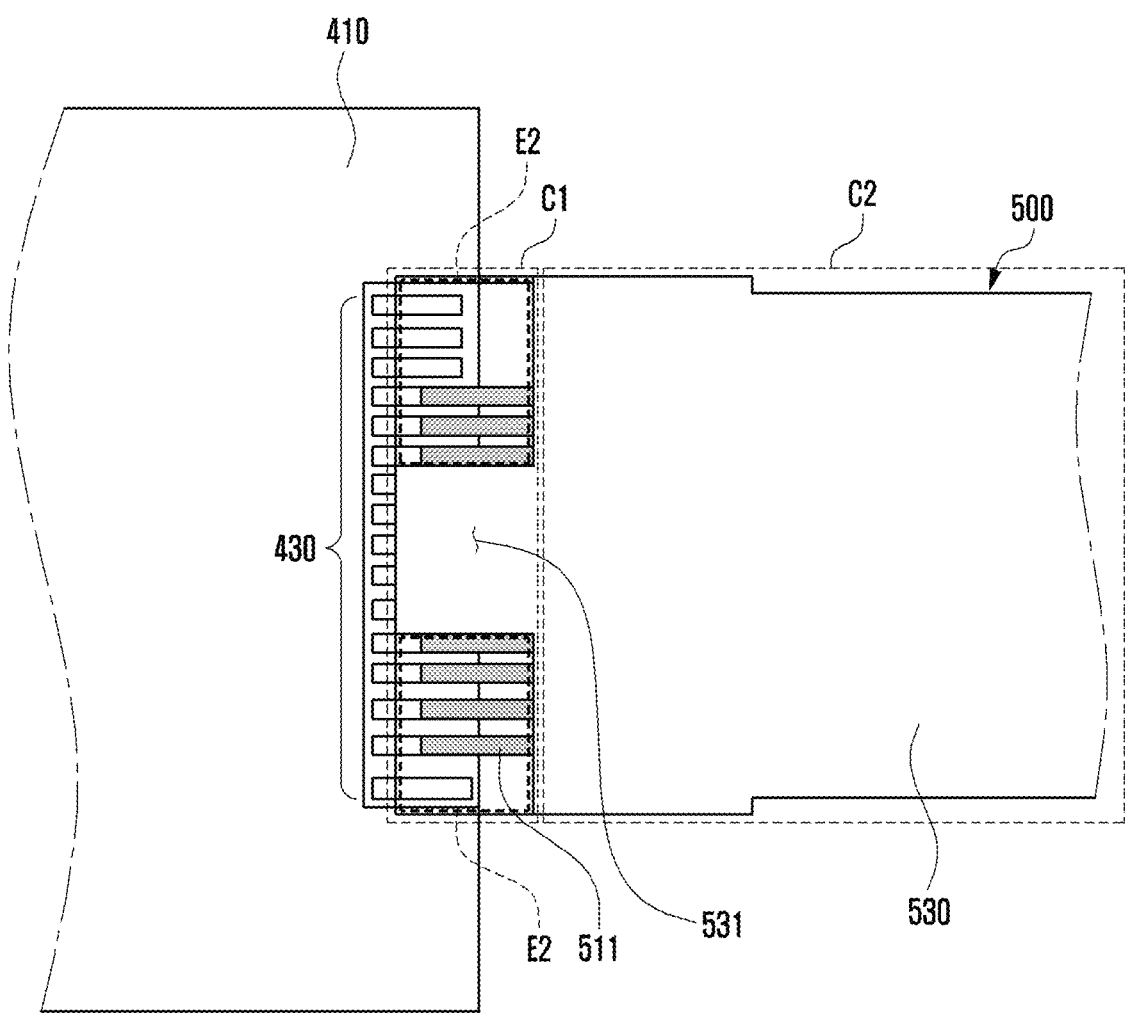
FIG. 8A illustrates a partial plan view of a state in which a flexible circuit board is aligned with a printed circuit board according to various embodiments of the disclosure.
Figure 8B:
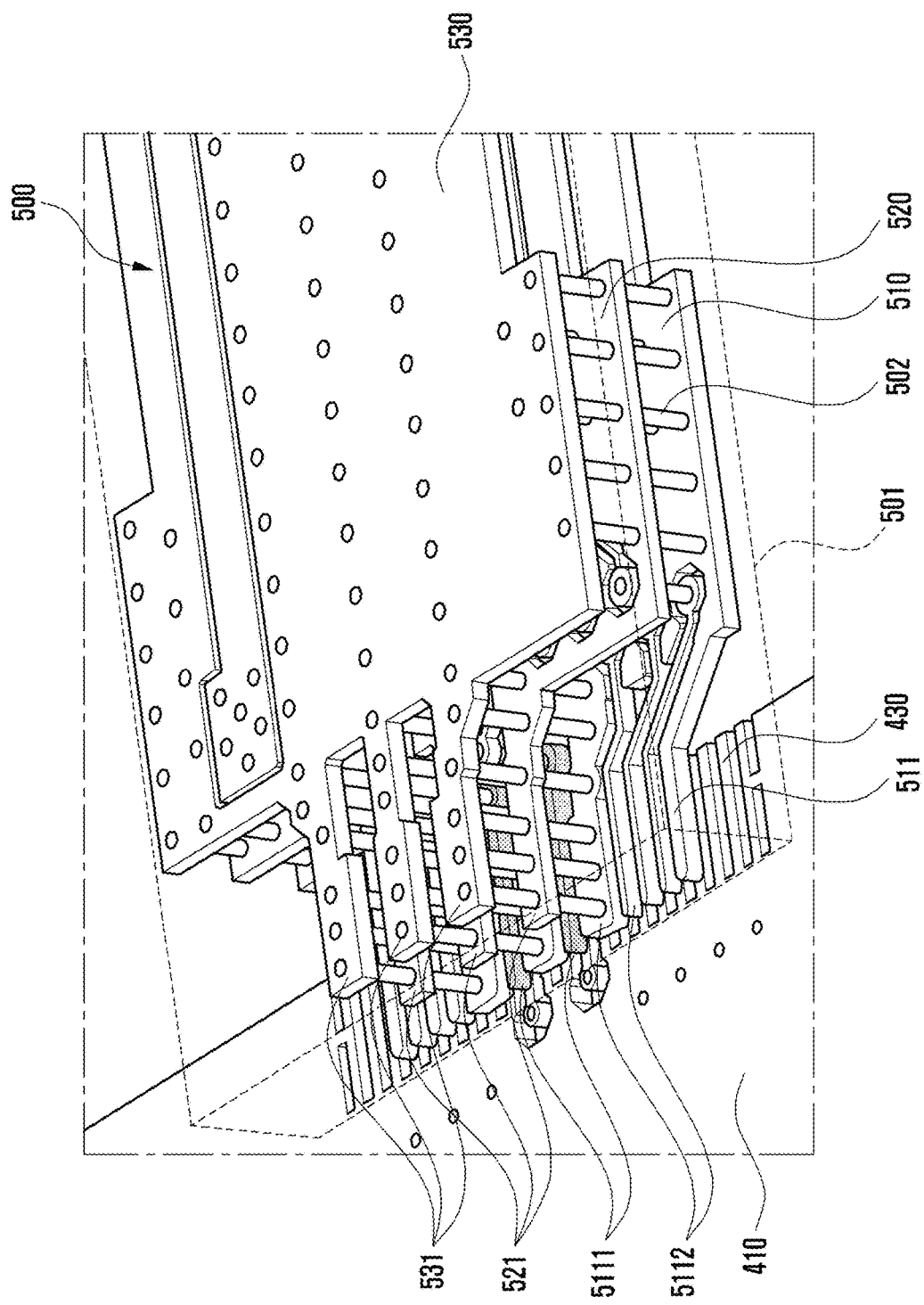
FIG. 8B illustrates a partial perspective view of a state in which a flexible circuit board is aligned with a printed circuit board according to various embodiments of the disclosure.
Figure 8C:
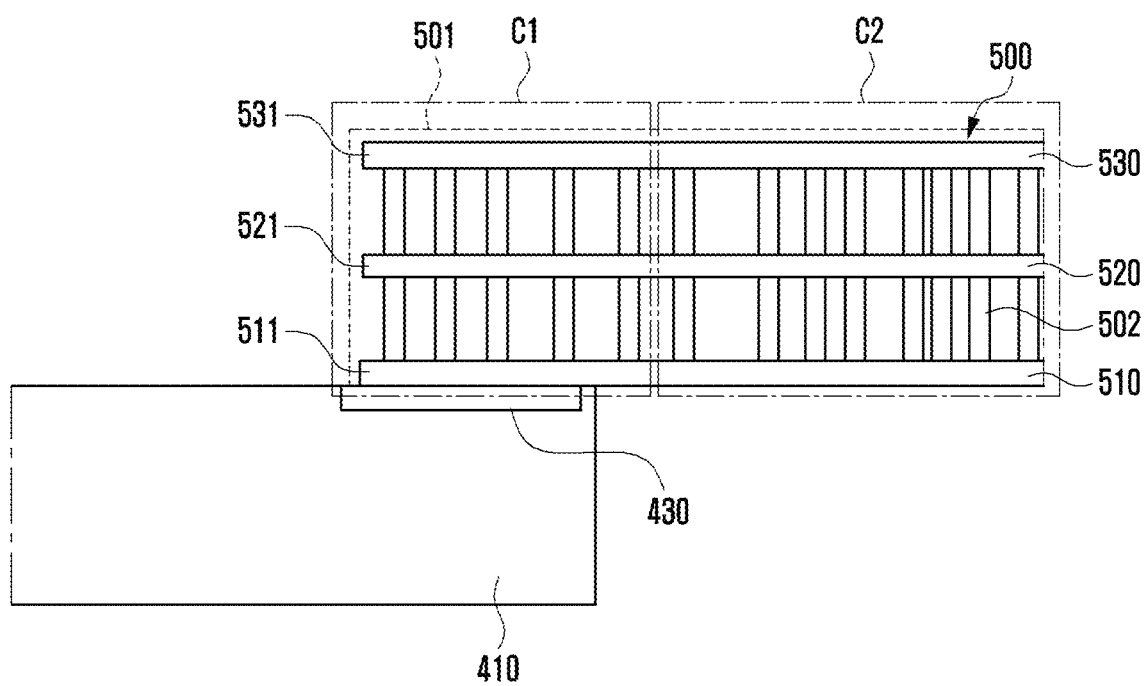
FIG. 8C illustrates a partial cross-sectional view of a state in which a flexible circuit board is aligned with a printed circuit board according to various embodiments of the disclosure.

FIG. 8A illustrates a partial plan view of a state in which a flexible circuit board 500 is aligned with a printed circuit board 410 according to various embodiments of the disclosure, FIG. 8B illustrates a partial perspective view of a state in which a flexible circuit board 500 is aligned with a printed circuit board 410 according to various embodiments of the disclosure, and FIG. 8C illustrates a partial cross-sectional view of a state in which a flexible circuit board 500 is aligned with a printed circuit board 410 according to various embodiments of the disclosure.

Referring to FIGS. 8A to 8C, when viewed from above the flexible circuit board 500, the flexible circuit board 500 may include at least one signal terminal 5111 and a first extension area 531 extended to an area overlapped with the ground terminals 5112 enclosing the at least one signal terminal 5111 at the first connection portion C1. According to an embodiment, the flexible circuit board 500 may include a pair of transmissive areas E2 formed at the left and right sides of the first extension area 531. In this case, in the first extension area 531, at least a portion of the third conductive layer 530 of the extending portion C2 may be extended to the first connection portion C1. According to an embodiment, the flexible circuit board 500 may include a second extension area 521 in which at least a portion of the second conductive layer 520 of the extending portion C2 is extended to the first connection portion C1. According to an embodiment, when viewed from above the flexible circuit board 500, the first extension area 531 and the second extension area 521 may overlap at least partially. In this case, noise may be shielded by at least one of peripheral ground terminals 5112, the first extension area 531, or the second extension area 521 in the first connection portion C1 of the at least one signal terminal 5111. According to an embodiment, noise can be shielded and an insertion loss can be reduced by being enclosed by the peripheral ground terminals 5112, the first extension area 531, or the second extension area 521.

According to various embodiments, the flexible circuit board 500 may include transmissive areas E2 in which the second conductive layer 520 and the third conductive layer 530 are removed through some areas of the first connection portion C1. In this case, when viewed from above the flexible circuit board 500, in the first connection portion C1, some terminals of the plurality of second conductive terminals 511 visible through the transmissive areas E2 made of the insulating material 501 of a semi-transparent material in which at least some of light can transmit may be accurately electrically connected to the printed circuit board 410 through accurate alignment with some terminals of the plurality of first conductive terminals 430 of the printed circuit board 410 visible from below.

Figure 9A:
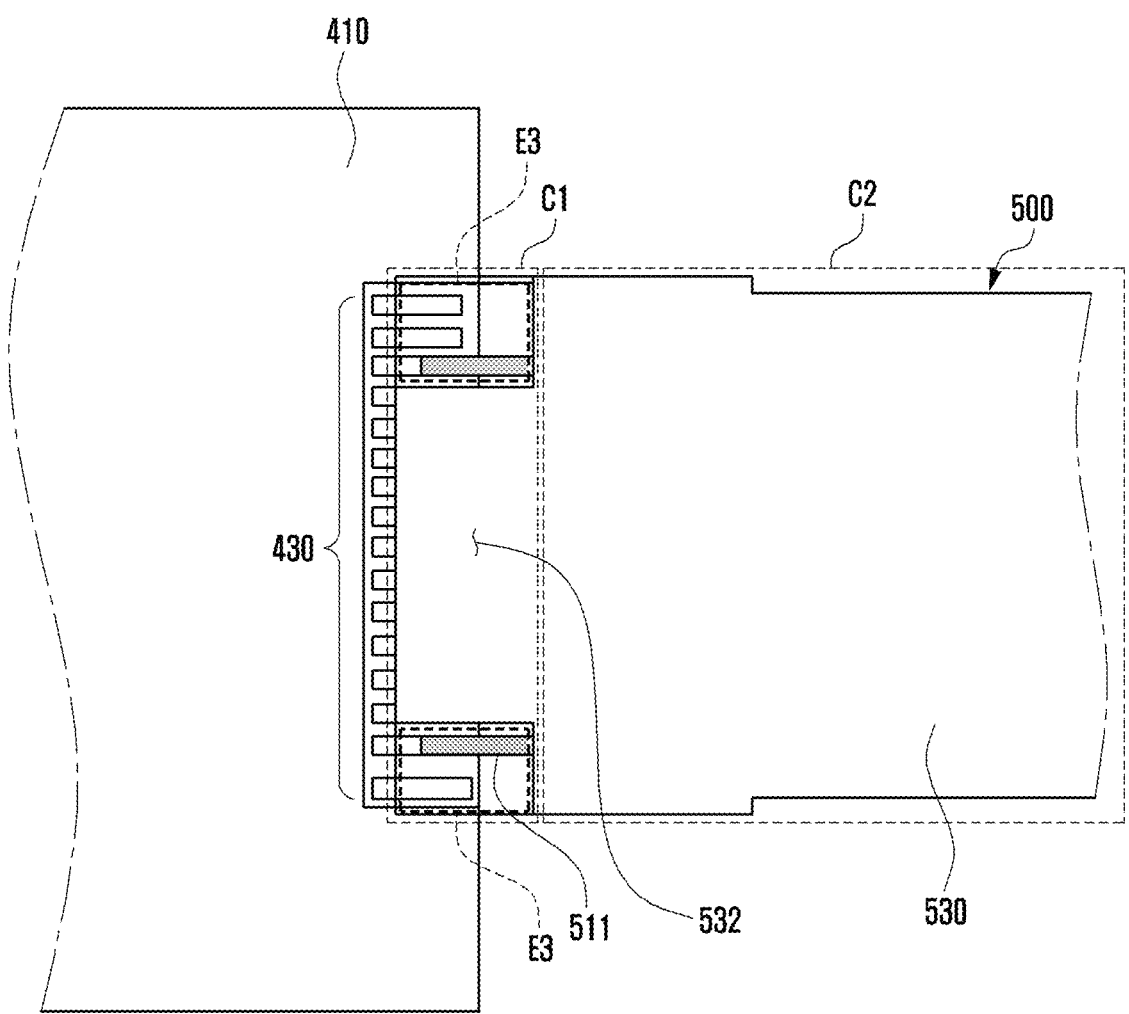
FIG. 9A illustrates a partial plan view of a state in which a flexible circuit board is aligned with a printed circuit board according to various embodiments of the disclosure.
Figure 9B:
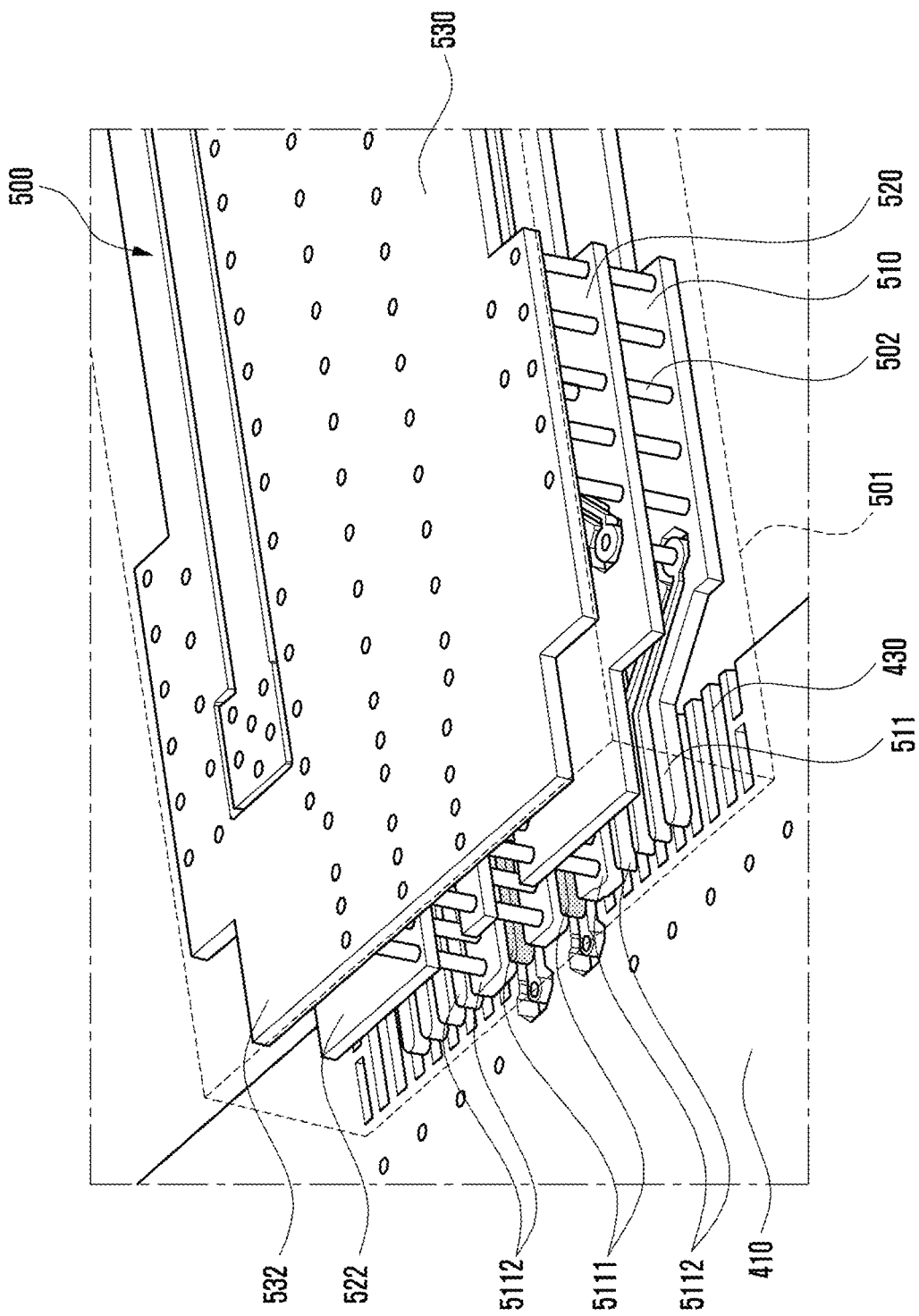
FIG. 9B illustrates a partial perspective view of a state in which a flexible circuit board is aligned with a printed circuit board according to various embodiments of the disclosure.
Figure 9C:
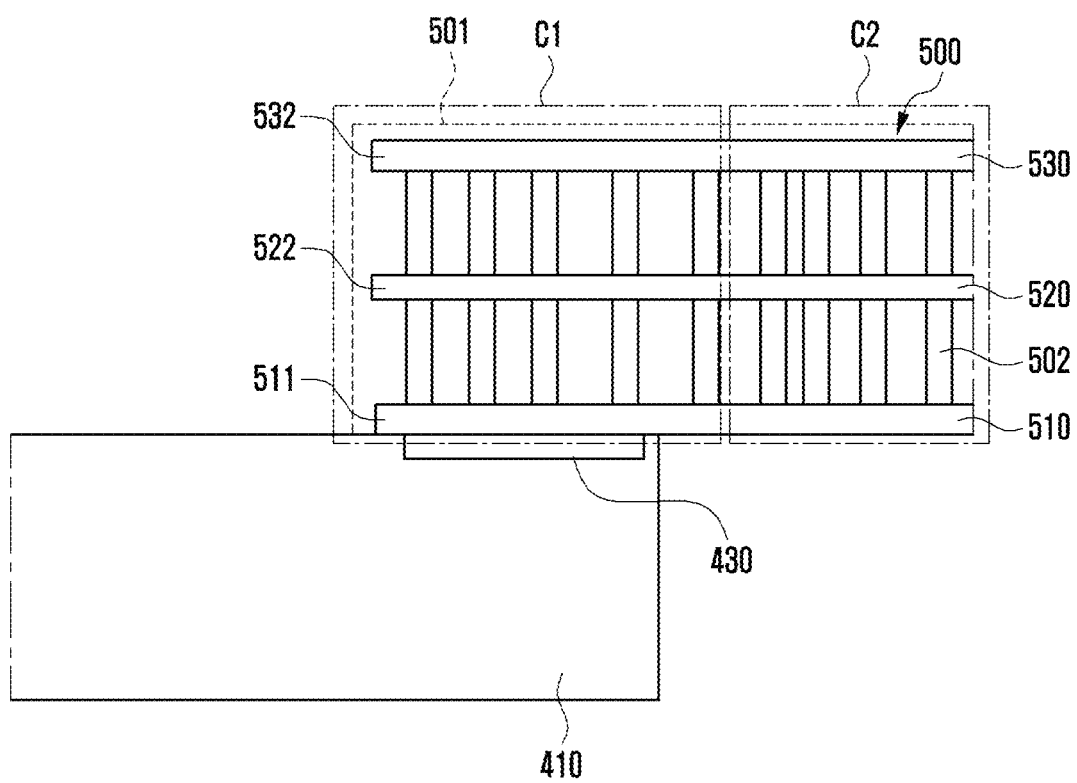
FIG. 9C illustrates a partial cross-sectional view of a state in which a flexible circuit board is aligned with a printed circuit board according to various embodiments of the disclosure.

FIG. 9A illustrates a partial plan view of a state in which a flexible circuit board 500 is aligned with a printed circuit board 410 according to various embodiments of the disclosure, FIG. 9B illustrates a partial perspective view of a state in which a flexible circuit board 500 is aligned with a printed circuit board 410 according to various embodiments of the disclosure, and FIG. 9C illustrates a partial cross-sectional view of a state in which a flexible circuit board 500 is aligned with a printed circuit board 410 according to various embodiments of the disclosure.

Referring to FIGS. 9A to 9C, when viewed from above the flexible circuit board 500, the flexible circuit board 500 may include at least one signal terminal 5111 and ground terminals 5112 enclosing the at least one signal terminal 5111 at the first connection portion C1. According to an embodiment, the flexible circuit board 500 may include a pair of transmissive areas E3 formed at the left and right sides of a first extension area 532. According to an embodiment, the pair of transmissive areas E3 may be smaller than a pair of transmissive areas E2 illustrated in FIG. 8A. According to an embodiment, in the first extension area 532, at least a portion of the third conductive layer 530 of the extending portion C2 may be extended to the first connection portion C1 to form the first extension area 532. According to an embodiment, the flexible circuit board 500 may include a second extension area 522 in which the second conductive layer 520 of the extending portion C2 is extended to the first connection portion C1. According to an embodiment, when viewed from above the flexible circuit board 500, the first extension area 532 and the second extension area 522 may overlap at least partially.

According to various embodiments, in the flexible circuit board 500, the second conductive layer 520 or the third conductive layer 530 may include at least one transmissive area E3 in which a partial area of the first connection portion C1 is removed. In this case, when viewed from above the flexible circuit board 500, in the first connection portion C1, at least one of a plurality of second conductive terminals 511 visible through the transmissive areas E3 made of the insulating material 501 of a translucent material may be accurately electrically connected to the printed circuit board 410 through accurate alignment with at least one of the plurality of first conductive terminals 430 of the printed circuit board 410 visible from below.

Figure 10A:
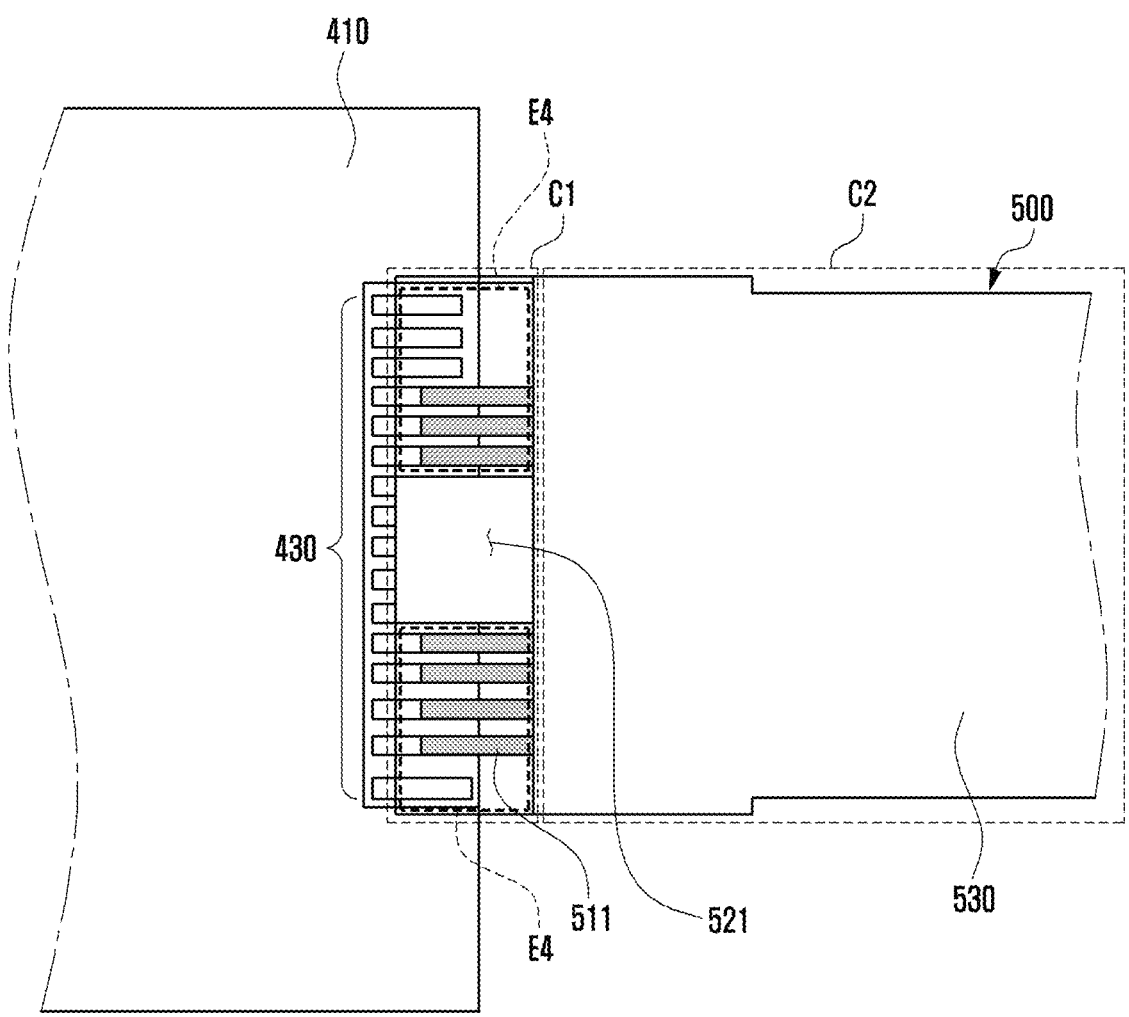
FIG. 10A illustrates a partial plan view of a state in which a flexible circuit board is aligned with a printed circuit board according to various embodiments of the disclosure.
Figure 10B:
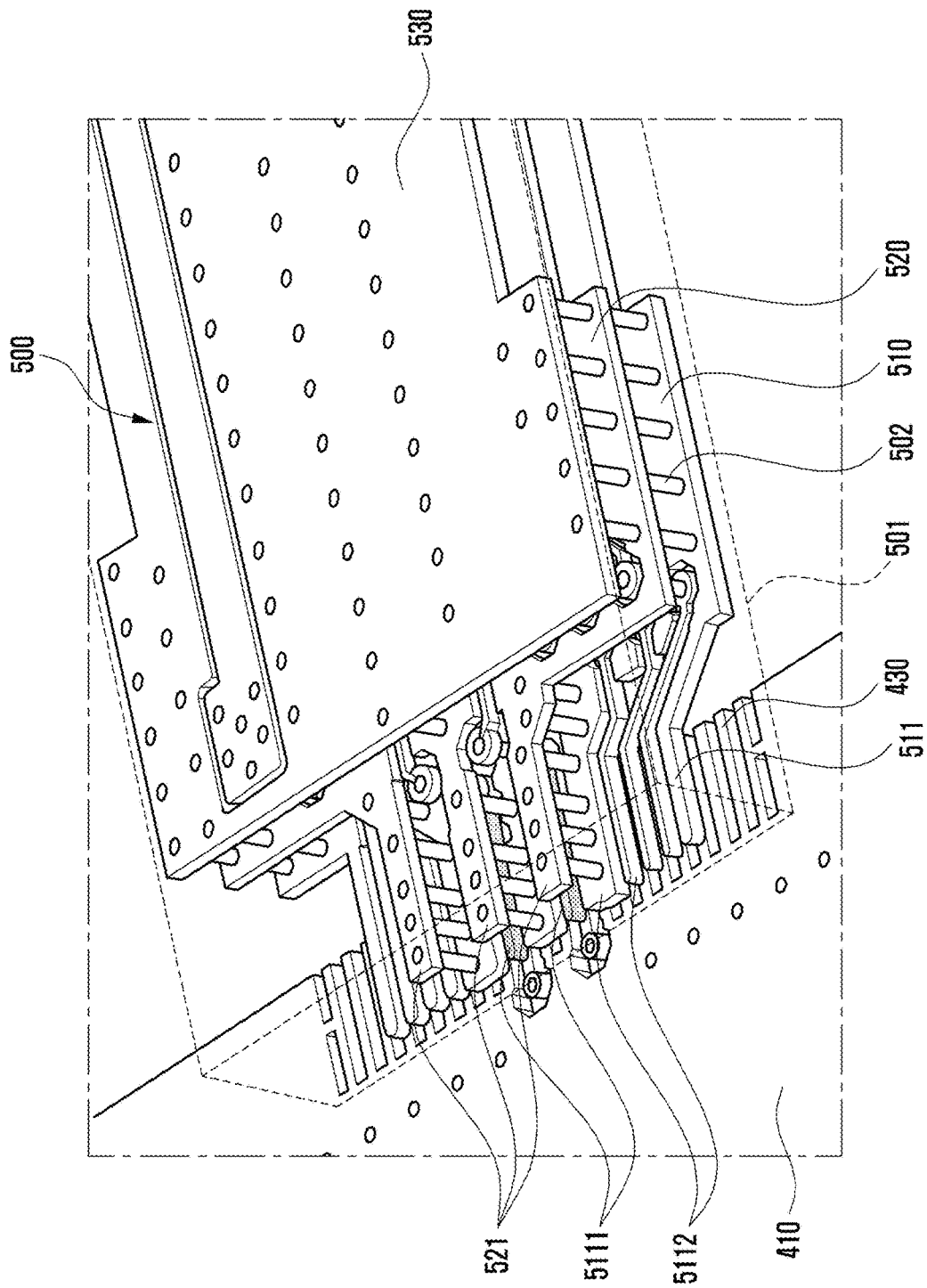
FIG. 10B illustrates a partial perspective view of a state in which a flexible circuit board is aligned with a printed circuit board according to various embodiments of the disclosure.
Figure 10C:
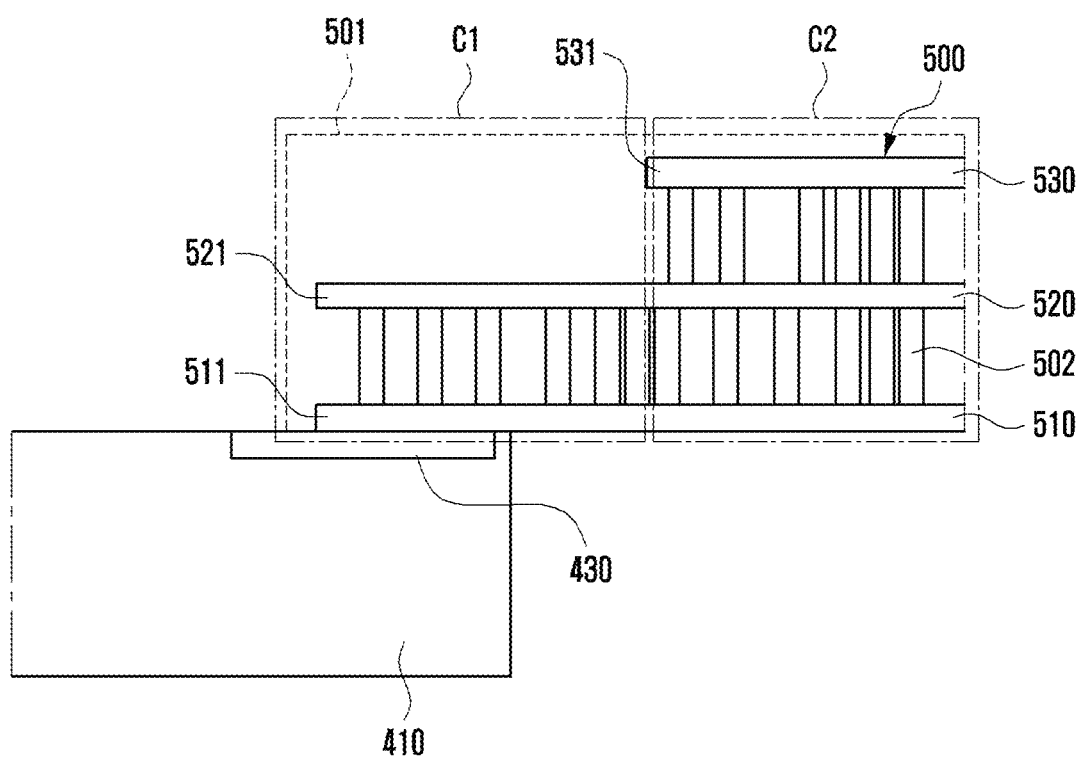
FIG. 10C illustrates a partial cross-sectional view of a state in which a flexible circuit board is aligned with a printed circuit board according to various embodiments of the disclosure.

FIG. 10A illustrates a partial plan view of a state in which a flexible circuit board 500 is aligned with a printed circuit board 410 according to various embodiments of the disclosure, FIG. 10B illustrates a partial perspective view of a state in which a flexible circuit board 500 is aligned with a printed circuit board 410 according to various embodiments of the disclosure, and FIG. 10C illustrates a partial cross-sectional view of a state in which a flexible circuit board 500 is aligned with a printed circuit board 410 according to various embodiments of the disclosure.

Referring to FIGS. 10A to 10C, when viewed from above the flexible circuit board 500, the flexible circuit board 500 may have the same transmissive area E4 as that of the configuration of FIGS. 8A to 8C, but the first extension area (e.g., the first extension area 531 of FIG. 8A) extended from the third conductive layer 530 may be removed, and a second extension area 521 extended from the second conductive layer 520 may be formed.

Figure 11A:
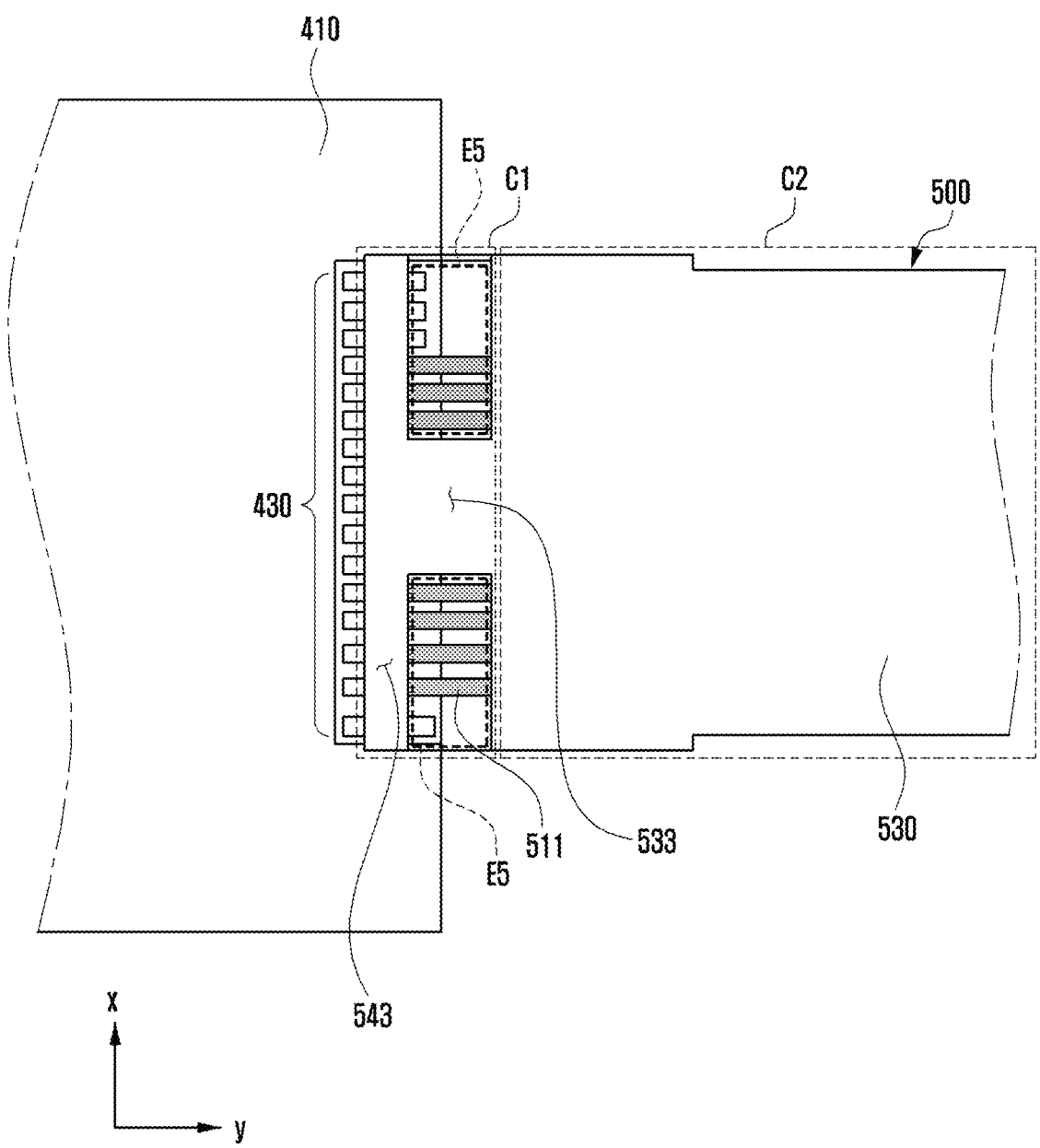
FIG. 11A illustrates a partial plan view of a state in which a flexible circuit board is aligned with a printed circuit board according to various embodiments of the disclosure.
Figure 11B:
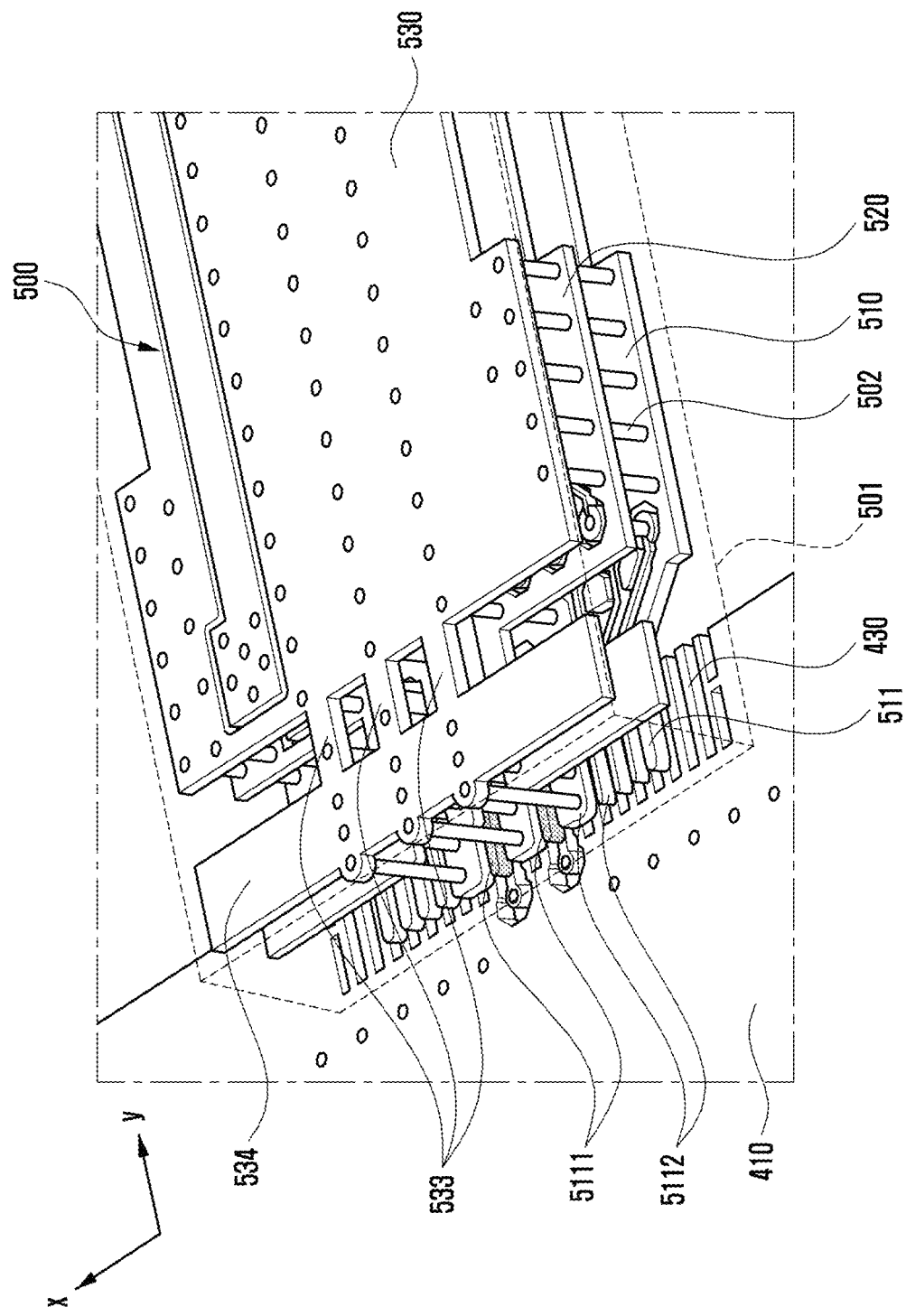
FIG. 11B illustrates a partial perspective view of a state in which a flexible circuit board is aligned with a printed circuit board according to various embodiments of the disclosure.
Figure 11C:
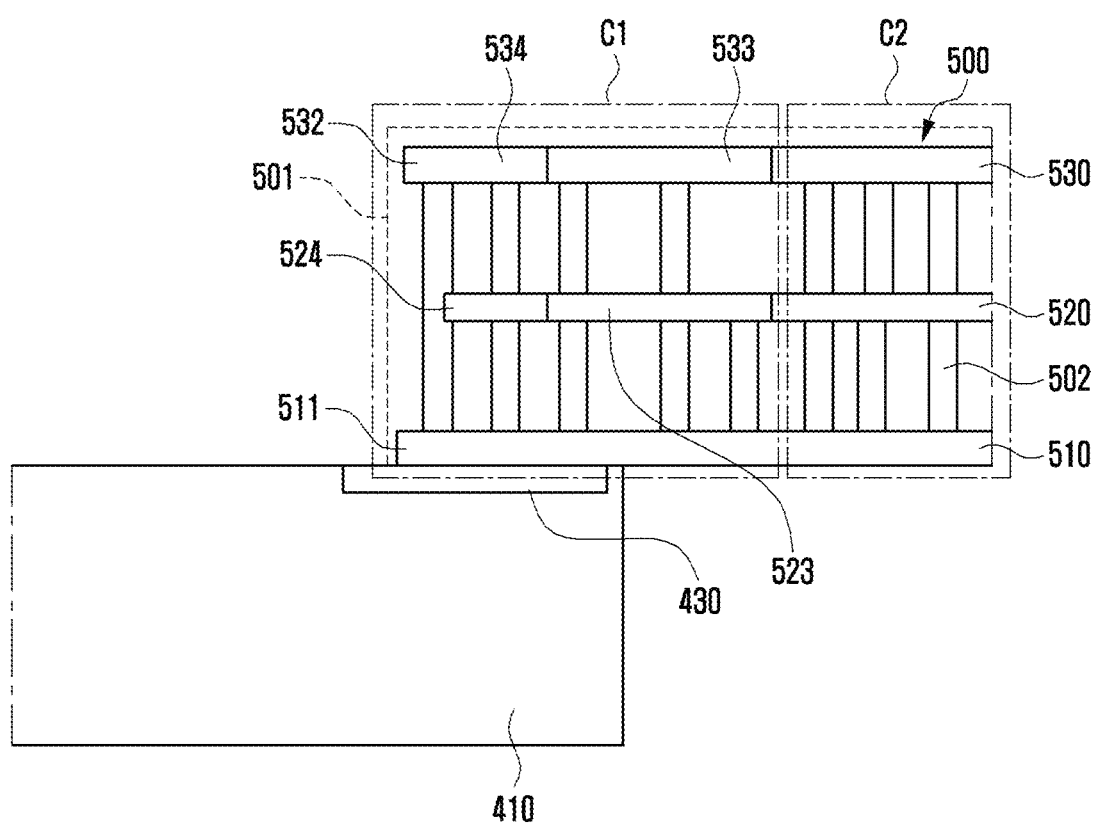
FIG. 11C illustrates a partial cross-sectional view of a state in which a flexible circuit board is aligned with a printed circuit board according to various embodiments of the disclosure.

FIG. 11A illustrates a partial plan view of a state in which a flexible circuit board 500 is aligned with a printed circuit board 410 according to various embodiments of the disclosure, FIG. 11B illustrates a partial perspective view of a state in which a flexible circuit board 500 is aligned with a printed circuit board 410 according to various embodiments of the disclosure, and FIG. 11C illustrates a partial cross-sectional view of a state in which a flexible circuit board 500 is aligned with a printed circuit board 410 according to various embodiments of the disclosure.

Referring to FIGS. 11A to 11C, when viewed from above the flexible circuit board 500, the flexible circuit board 500 may include a first extension area 533 in which at least a portion of the third conductive layer 530 is extended from the extending portion C2 to a portion of the first connection portion C1 and a second extension area 543 extended from the first extension area 533 in the first connection portion C1. According to an embodiment, a width of the first extension area 533 may be smaller than that of the second extension area 543. According to one embodiment, the first extension area 533 may be formed in the form that covers at least a portion in order to shield noise that may affect the signal terminal 5111 or ground terminals 5112 that may be disposed around the signal terminal. For example, when viewed from the first extension area 533, the first extension area 533 may be formed in a size to overlap at least one signal terminal 5111 and ground terminals 5112 enclosing the at least one signal terminal 5111. For example, a width of the first extension area 533 may be substantially the same as that of the first extension area 531 of FIG. 8A. According to an embodiment, when viewed from above the second extension area 543, the second extension area 543 may be formed in a size overlapped with all of the plurality of second conductive terminals 511 in a width direction (e.g., the x direction of FIG. 11A). For example, a width of the second extension area 543 may be substantially the same as that of the third conductive layer 530 disposed in the extending portion C2. According to an embodiment, the flexible circuit board 500 may include a pair of transmissive areas E5 formed at the left and right sides of the first extension area 533. According to one embodiment, when viewed from above the flexible circuit board 500, the flexible circuit board 500 may include a third extension area (the third extension area 523 of FIG. 11C) in which at least a portion of the second conductive layer 520 is extended to a portion of the first connection portion C1 and formed to overlap the first extension area 533 and a fourth extension area 524 extended from the third extension area 523 and formed to overlap the second extension area 543. Accordingly, when viewed from above the flexible circuit board 500, in the first connection portion C1, some of the plurality of second conductive terminals 511 extended from the first conductive layer 510 and/or the second conductive layer 520 may be disposed to be visible through a pair of transmissive areas E5.

According to various embodiments, when viewed from above the flexible circuit board 500, in the first connection portion C1, at least one of the plurality of conductive terminals 511 visible through the transmissive areas E5 made of the insulating material 501 of a transparent material may be accurately electrically connected to the printed circuit board 410 through accurate alignment with at least one of the plurality of first conductive terminals 430 of the printed circuit board 410 visible from below. Further, by a structural shape of the first extension area 533 and the third extension area 523 having sizes smaller than those of the second extension area 534 and the fourth extension area 524, a heat diffusion phenomenon can be prevented in which a heat generated in the first connection portion C1 during a connection process is transferred to the extending portion C2.

Figure 12A:
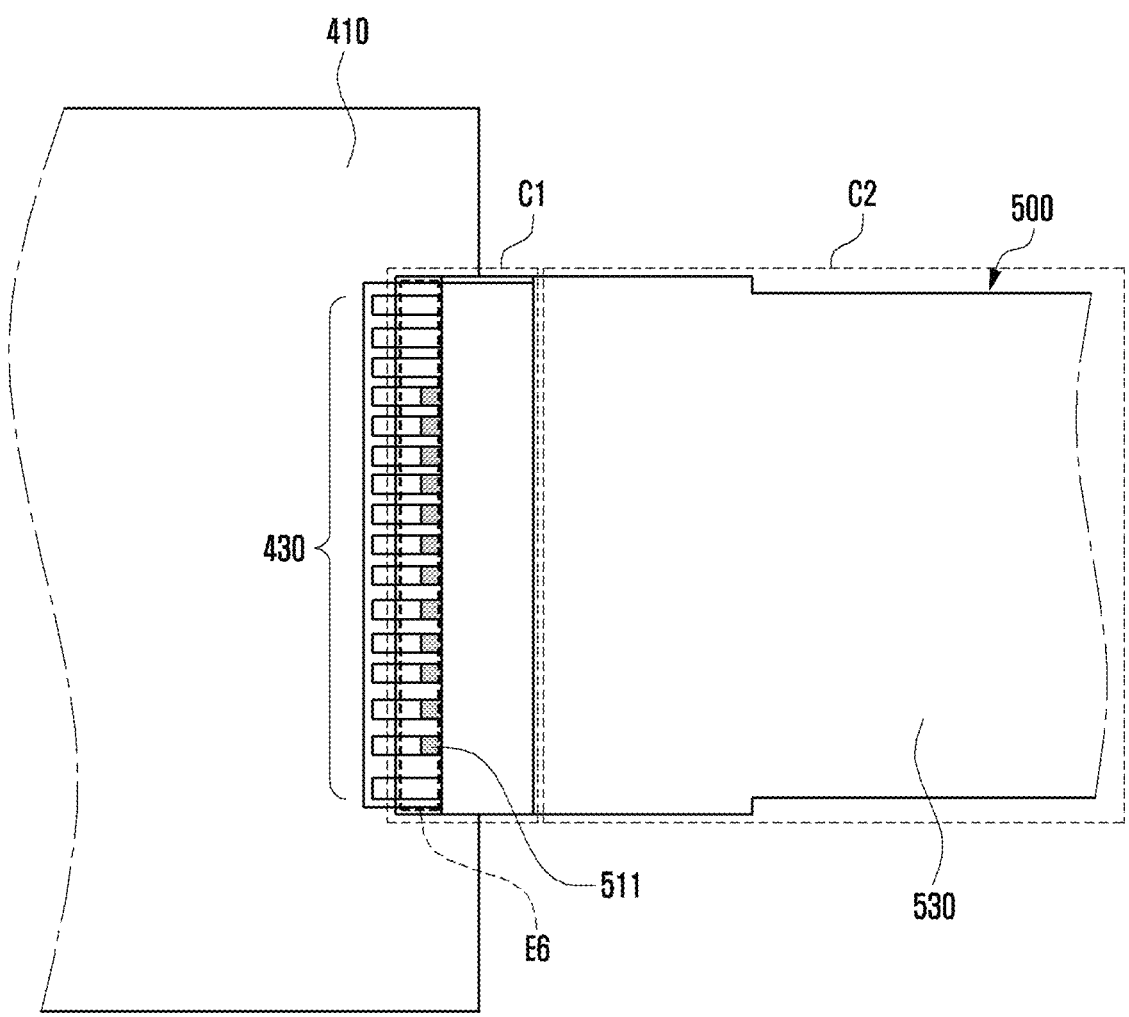
FIG. 12A illustrates a partial plan view of a state in which a flexible circuit board is aligned with a printed circuit board according to various embodiments of the disclosure.
Figure 12B:
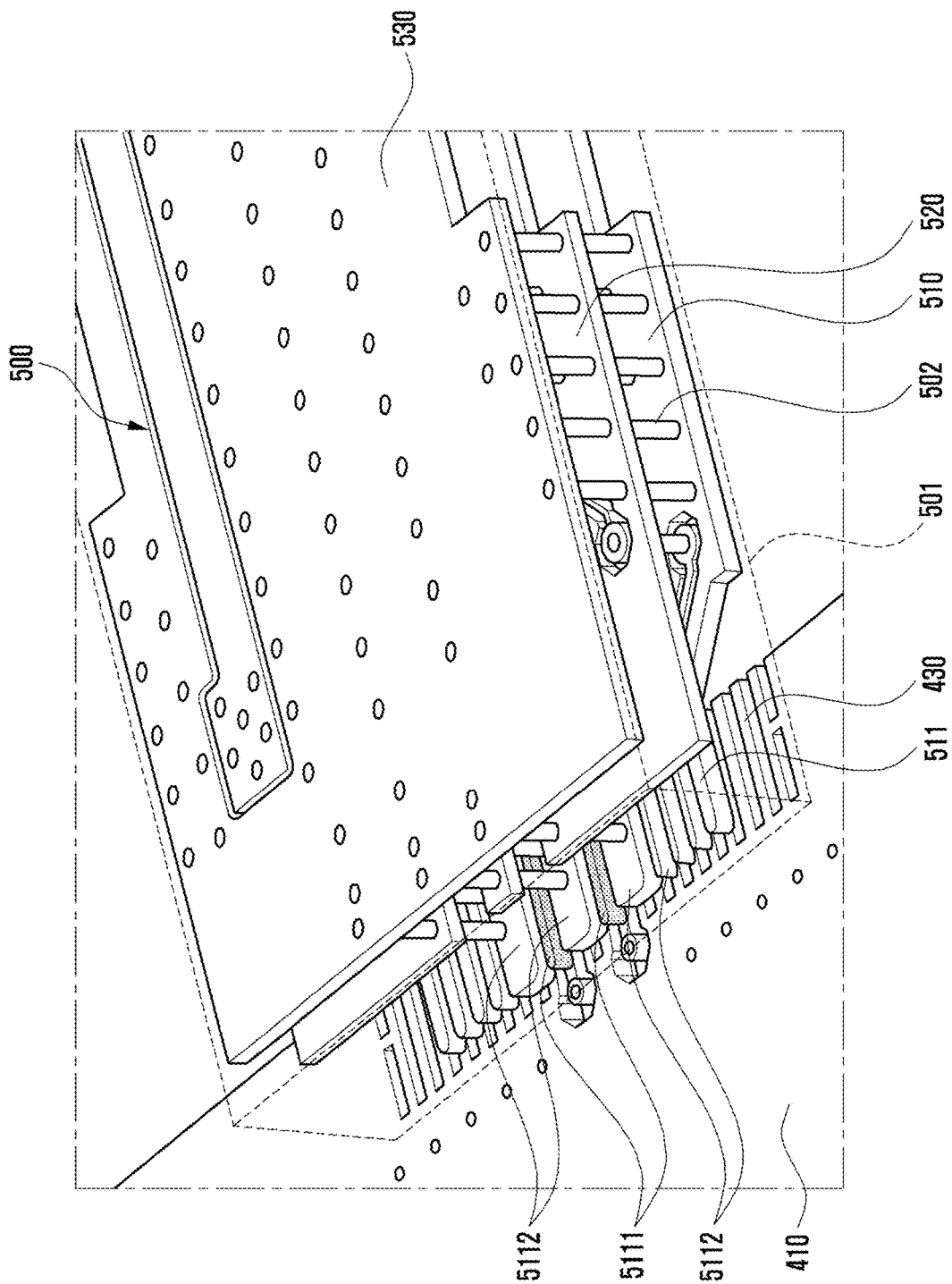
FIG. 12B illustrates a partial perspective view of a state in which a flexible circuit board is aligned with a printed circuit board according to various embodiments of the disclosure.
Figure 12C:
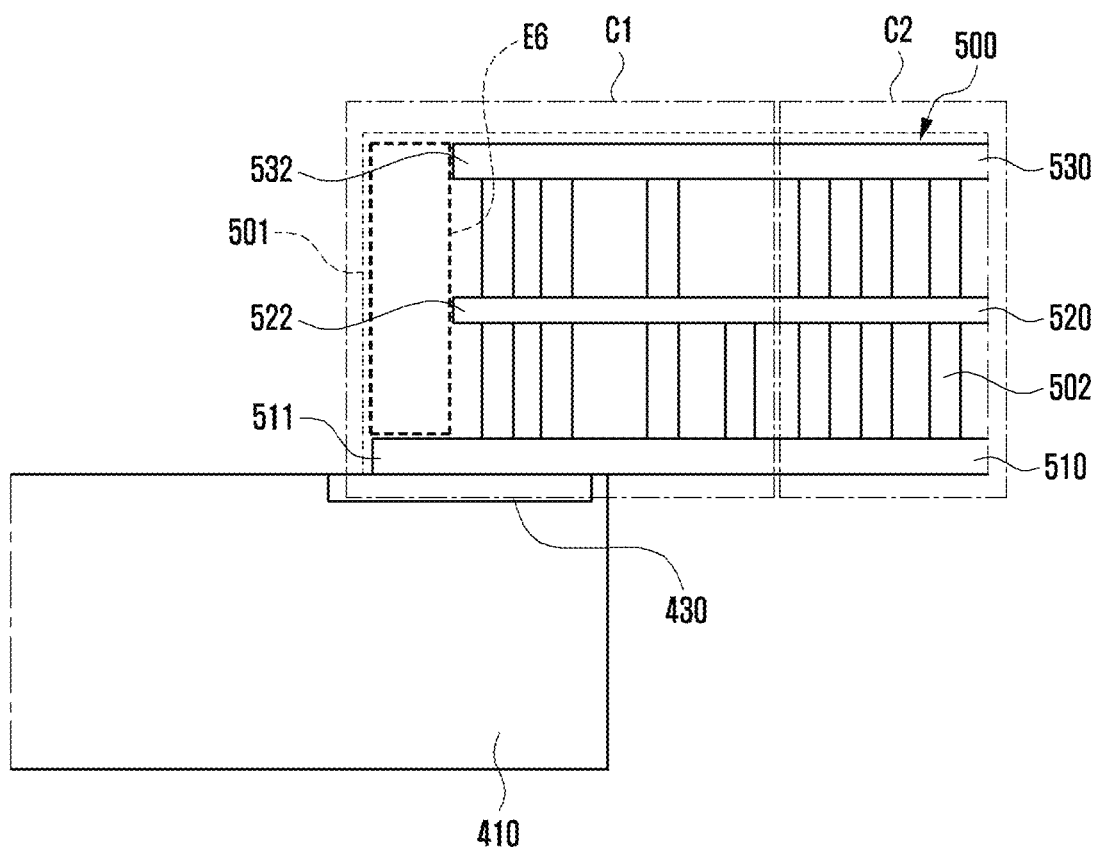
FIG. 12C illustrates a partial cross-sectional view of a state in which a flexible circuit board is aligned with a printed circuit board according to various embodiments of the disclosure.

FIG. 12A illustrates a partial plan view of a state in which a flexible circuit board 500 is aligned with a printed circuit board 410 according to various embodiments of the disclosure, FIG. 12B illustrates a partial perspective view of a state in which a flexible circuit board 500 is aligned with a printed circuit board 410 according to various embodiments of the disclosure, and FIG. 12C illustrates a partial cross-sectional view of a state in which a flexible circuit board 500 is aligned with a printed circuit board 410 according to various embodiments of the disclosure.

Referring to FIGS. 12A to 12C, in the flexible circuit board 500, the third conductive layer 530 and the second conductive layer 520 of the extending portion C2 may be extended to at least a portion of the first connection portion C1. According to one embodiment, when viewed from above the flexible circuit board 500, the flexible circuit board 500 may include a transmissive area E6 in which some of the third conductive layer 530 and the second conductive layer 520 are omitted so that only end portions of the plurality of second conductive terminals 511 may be viewed collectively. In this case, the flexible circuit board 500 may help to extend a ground area disposed to enclose at least one signal terminal 5111 while accurate electrical connection with the printed circuit board 410 is performed through the transmissive area E6.

Figure 13:
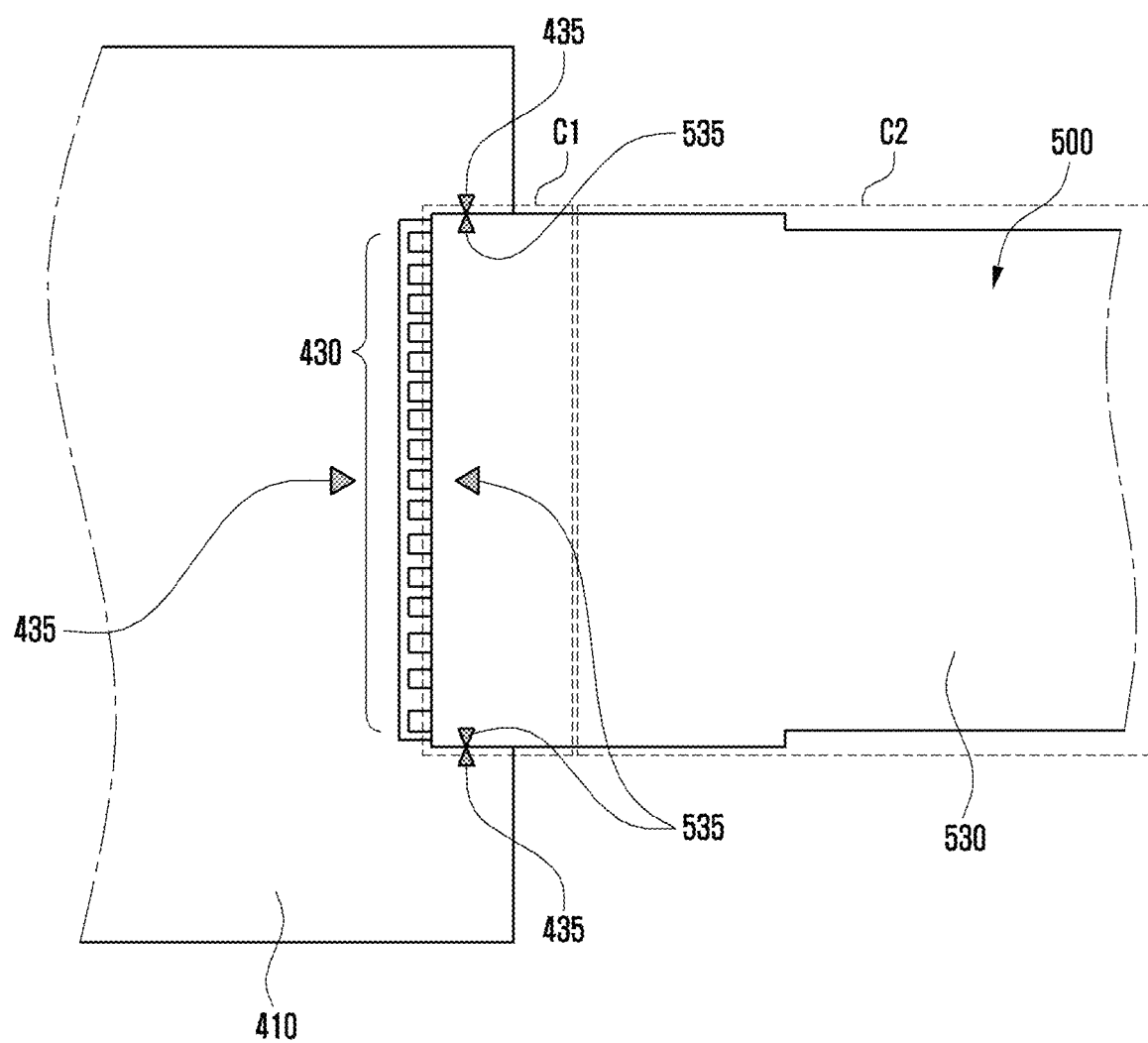
FIG. 13 illustrates a partial plan view of a state in which a flexible circuit board is aligned with a printed circuit board according to various embodiments of the disclosure.

FIG. 13 illustrates a partial plan view of a state in which the flexible circuit board 500 is aligned with the printed circuit board 410 according to various embodiments of the disclosure.

Referring to FIG. 13, when viewed from above the flexible circuit board 500, the plurality of second conductive terminals 511 may be configured to be invisible through the third conductive layer 530 and/or the second conductive layer 520 extended from the connecting portion C2 to the first connecting portion C1. According to an embodiment, the flexible circuit board 500 may include at least one first alignment marker 535 disposed along an edge in the first connection portion C1. According to one embodiment, the printed circuit board 410 may include at least one second alignment marker 435 disposed to correspond to the at least one first alignment marker 535 around the plurality of first conductive terminals 430. Therefore, even if the above-described transmissive areas E1, E2, E3, E4, E5, and E6 do not exist, the flexible circuit board 500 may perform an accurate alignment operation through the alignment markers 535 and 435. According to an embodiment, the alignment markers 535 and 435 may include a printing material or laser engraving formed at corresponding positions of the flexible circuit board 500 and the printed circuit board 410.

FIG. illustrates is a graph comparing insertion losses when the flexible circuit boards of FIGS. 7A and 8A are electrically connected to the printed circuit boards according to various embodiments of the disclosure.

Figure 14:
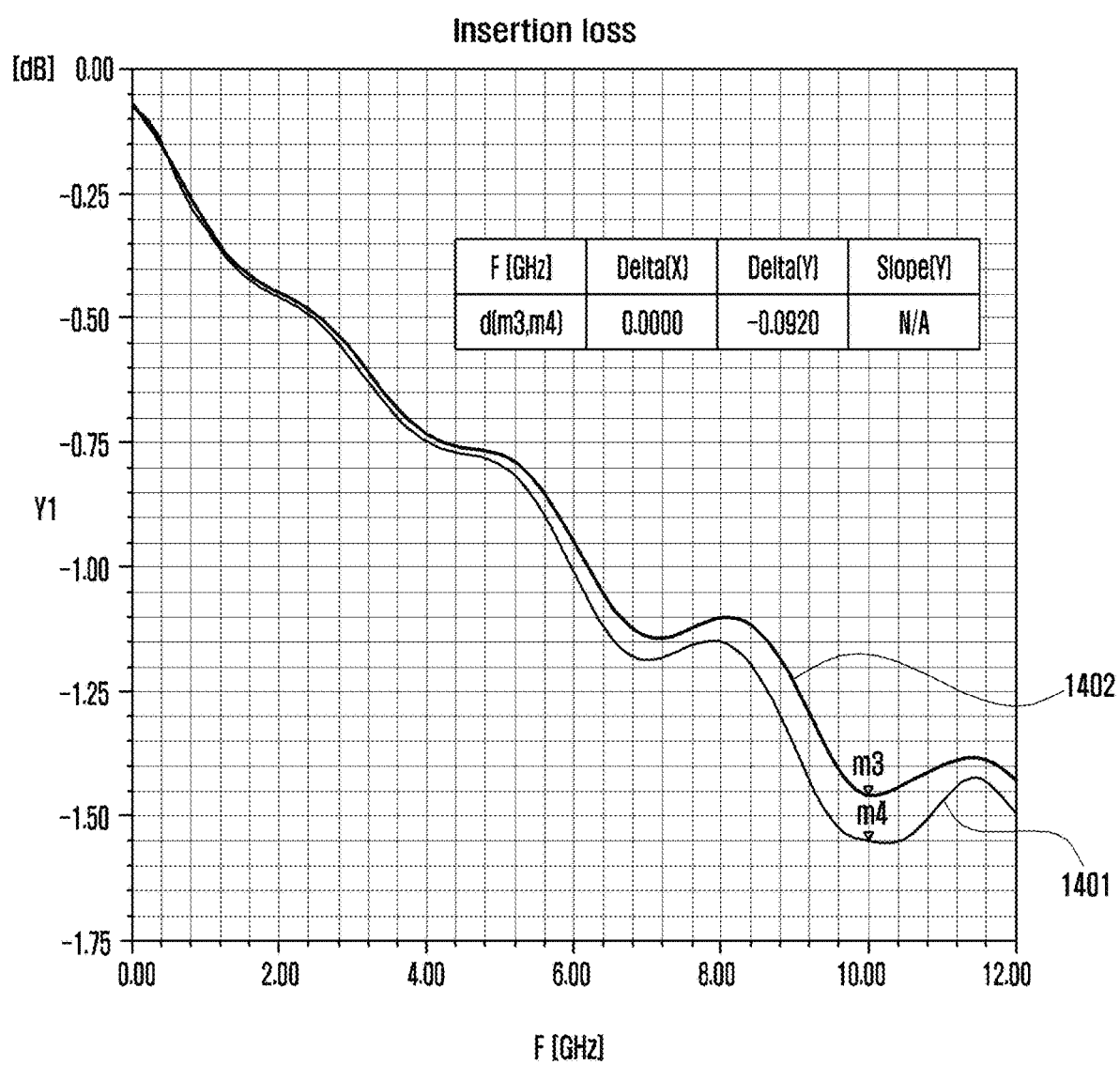
FIG. 14 illustrates a graph comparing insertion losses when the flexible circuit boards of FIGS. 7A and 8A are electrically connected to the printed circuit boards according to various embodiments of the disclosure.

Referring to FIG. 14, in the case (graph 1402) including an first extension area 531 in which the second conductive layer 520 and the third conductive layer 530 are at least partially extended to the first connection portion C1 in the vicinity of the signal terminal 5111, as illustrated in FIG. 8A rather than the case (graph 1401) including a transmissive area E1 in which both the second conductive layer 520 and the third conductive layer 530 are removed in the vicinity of at least one signal terminal 5111, as illustrated in FIG. 7A, it can be seen that an insertion loss related to signal transfer of the flexible circuit board 500 is less. Accordingly, while the flexible circuit board 500 includes a transmissive area that may be aligned with the printed circuit board 410, when a reinforced ground area is additionally disposed around the at least one signal terminal 5111, it can be seen that a performance of the flexible circuit board 500 is further excellent.

Figure 15A:
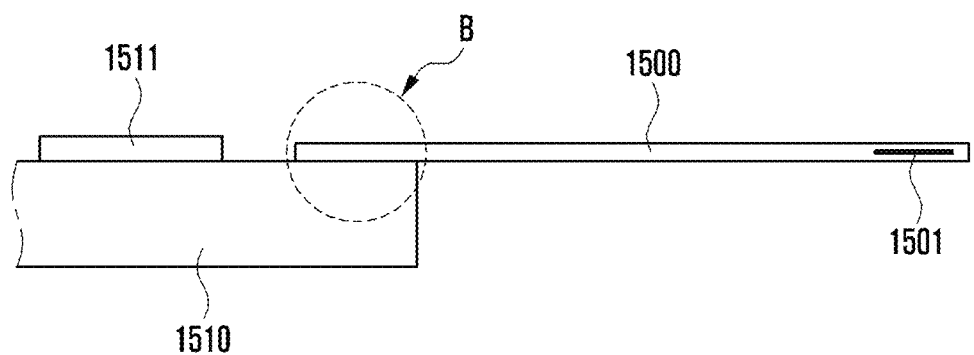
FIGS. 15A and 15B illustrate diagrams of a state in which a printed circuit board and an antenna structure are connected through a flexible circuit board according to various embodiments of the disclosure.
Figure 15B:
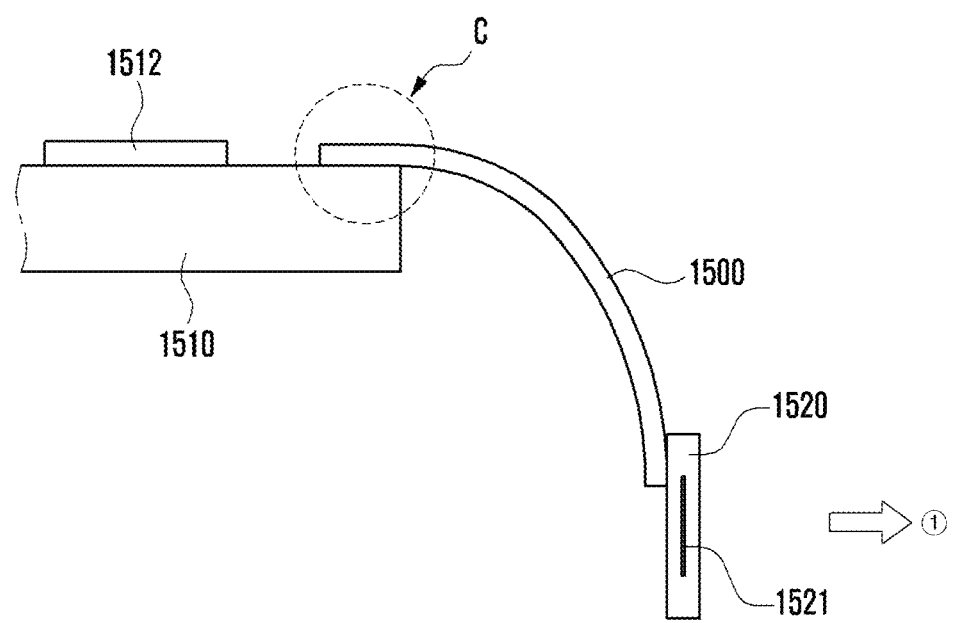

FIGS. 15A and 15B illustrate diagrams of a state in which a printed circuit board 1510 and antenna elements 1501 and 1520 are connected through a flexible circuit board 1500 according to various embodiments of the disclosure.

The flexible circuit board 1500 of FIGS. 15A and 15B may be at least partially similar to the flexible circuit board 500 of FIG. 4 or may further include other components of the flexible circuit board.

Referring to FIG. 15A, when it is necessary to dispose the antenna element 1501 at a position spaced apart from the printed circuit board 1510 including a wireless communication circuit 1511, the antenna element 1501 may receive compensation of a separation distance through the flexible circuit board 1500 having a predetermined length. According to an embodiment, one end of the flexible circuit board 1500 may be electrically connected to the printed circuit board 1510 (e.g., the main board). In this case, an alignment structure of a plurality of conductive terminals (e.g., the plurality of first conductive terminals 430 and the plurality of second conductive terminals 511 in FIG. 5) through the above-described transmissive area E1, E2, E3, E4, E5, or E6 may be applied to an electrically connected portion (area B) of the flexible circuit board 1500 and the printed circuit board 1510. According to an embodiment, the flexible circuit board 1500 may include at least one antenna element 1501 disposed at the other end to operate as an antenna structure. According to an embodiment, the antenna element 1501 may include a conductive pattern of a predetermined shape formed in the flexible circuit board 1500. Accordingly, the wireless communication circuit 1511 may transmit and/or receive radio signals through at least one antenna element 1501 disposed at the end of the flexible circuit board 1500. According to one embodiment, the wireless communication circuit 1511 may be configured to transmit and/or receive radio signals in a first frequency range through at least one antenna element 1501. According to an embodiment, the first frequency range may include a range of about 800 MHz to 3000 MHz. In another embodiment, the wireless communication circuit 1511 may be configured to transmit and/or receive radio signals in a second frequency range to be described later.

Referring to FIG. 15B, when it is necessary to dispose the antenna structure 1520 at a position spaced apart from the printed circuit board 1510 including a wireless communication circuit 1512, the antenna structure 1520 may receive compensation of a separation distance through a flexible circuit board 1500 having a predetermined length. For example, an alignment structure of a plurality of conductive terminals (e.g., the plurality of first conductive terminals 430 and the plurality of second conductive terminals 511 of FIG. 5) through the above-described transmissive area E1, E2, E3, E4, E5, or E6 may be applied to a portion (area C) in which the flexible circuit board 1500 and the printed circuit board 1510 are electrically connected. According to an embodiment, the antenna structure 1520 disposed at the other end of the flexible circuit board 1500 may include a dielectric substrate and at least one antenna element 1521 disposed at the dielectric substrate. According to one embodiment, the dielectric substrate may include a printed circuit board or a dielectric carrier. According to one embodiment, the at least one antenna element 1521 may include an antenna array including conductive patterns or a plurality of conductive patches disposed at regular intervals in the dielectric substrate. In this case, the wireless communication circuit 1512 may be configured to transmit and/or receive radio signals in a second frequency range through at least one antenna element 1521. According to an embodiment, the second frequency range may include a range of about 3 GHz to 100 GHz. In another embodiment, the wireless communication circuit 1512 may be configured to transmit and/or receive radio signals in the above-described first frequency range. According to an embodiment, the antenna structure 1520 may be configured to form a beam pattern in a first direction (e.g., direction) according to a disposition structure thereof. For example, when at least one antenna element 1521 is disposed to face a side member (e.g., the lateral bezel structure 310 of FIG. 3) in an internal space of the electronic device (e.g., the electronic device 300 of FIG. 3), the beam pattern may be formed in a direction facing the side surface. In another embodiment, when at least one antenna element 1521 is disposed to face a front plate (e.g., the front plate 320 of FIG. 3) and/or the rear plate (e.g., the rear plate 380 of FIG. 3) in an internal space of the electronic device (e.g., the electronic device 300 of FIG. 3), the beam pattern may be formed in a direction facing the front plate 320 and/or the rear plate 380. For example, the antenna structure 1520 may be disposed to form a beam pattern in various directions in the internal space of the electronic device through flexible bendability of the flexible circuit board 1500.

The flexible circuit board according to various embodiments of the disclosure has an alignment structure for alignment with a plurality of terminals disposed at a printed circuit board to assist in accurate alignment between a plurality of terminals having a fine pitch and to prevent a malfunction of the device according to a connection failure. By a blocking layer formed through a portion of the flexible circuit board according to various embodiments of the disclosure, noise or interference phenomenon may be reduced.

According to various embodiments, an electronic device (e.g., the electronic device 300 of FIG. 3) may include a housing (e.g., the housing 110 of FIG. 1); a first circuit board (e.g., the first circuit board 410 of FIG. 7A) disposed in an internal space (e.g., the internal space 3001 of FIG. 4) of the housing and including a plurality of first conductive terminals (e.g., the plurality of first conductive terminals 430 of FIG. 7A); and a flexible circuit board (e.g., the flexible circuit board 500 of FIG. 7A) including a first connection portion (e.g., the first connection portion C1 of FIG. 7A) including a plurality of second conductive terminals (e.g., the plurality of second conductive terminals 511 of FIG. 7A) configured to connect to the plurality of first conductive terminals, a extending portion (e.g., the extending portion C2 of FIG. 7A) extended from the first connection portion, and at least one conductive layer extended from the extending portion to at least a portion of the first connection portion, wherein the flexible circuit board includes at least one transmissive area (e.g., the transmissive area E1 of FIG. 7A) in which light may be transmitted and in which the at least one conductive layer is at least partially omitted, and at least some of the plurality of second conductive terminals are disposed to be visible from the outside through the transmissive area.

According to various embodiments, when at least some of the plurality of first conductive terminals overlap at least some of the plurality of second conductive terminals to be electrically connected to the at least some of the plurality of second conductive terminals, at least some of the plurality of second conductive terminals may be visible through the at least one transmissive area.

According to various embodiments, the at least one conductive layer may be disposed through an insulating material (e.g., the insulating material 501 of FIG. 7B), and the transmissive area may be formed through the at least one insulating material of a transparent material.

According to various embodiments, the at least one conductive layer may include a first conductive layer (e.g., the first conductive layer 510 of FIG. 7B); a second conductive layer (e.g., the second conductive layer 520 of FIG. 7B) stacked on the first conductive layer and including at least one signal wiring; and a third conductive layer (e.g., the third conductive layer 530 of FIG. 7B) stacked on the second conductive layer, wherein the each conductive layer may be disposed to maintain a gap through an insulating material, and the conductive layers may be electrically connected to each other through conductive vias (e.g., the conductive vias 502 of FIG. 7B).

According to various embodiments, at least some of the plurality of second conductive terminals may include a plurality of ground terminals (e.g., the ground terminals 5112 of FIG. 7B) extended from the extending portion to the first connection portion in the first conductive layer.

According to various embodiments, at least some of the plurality of second conductive terminals may include at least one signal terminal electrically connected to the signal wiring through the conductive via in the first conductive layer and configured to transfer a signal through the signal wiring.

According to various embodiments, at least some of the plurality of second conductive terminals may include at least one signal transfer wiring layer (e.g., the signal transfer wiring layer 5111a of FIG. 7D) extended to the first connection portion so as to be insulated from a peripheral ground wiring layer in the second conductive layer of the extending portion.

According to various embodiments, the at least one signal transfer wiring layer may be electrically connected to the at least one signal terminal of the first conductive layer through at least one conductive via in the first connection portion.

According to various embodiments, the at least one signal terminal may be disposed between the plurality of ground terminals.

According to various embodiments, the electronic device may further include at least one extension area (e.g., the first extension area 531 of FIG. 8A) in which the first conductive layer and/or the second conductive layer are/is extended from the extending portion to at least a portion of the first connection portion.

According to various embodiments, when viewed from above the first connection portion, the at least one extension area may be disposed at a position overlapped with the signal terminal and some ground terminals around the signal terminal.

According to various embodiments, the electronic device may further include at least one antenna element (e.g., the antenna element 420 of FIG. 5) disposed at the first circuit board.

According to various embodiments, the electronic device may further include a second printed circuit board (e.g., the PCB 340 of FIG. 5) spaced apart from the first printed circuit board, wherein the flexible circuit board may further include a second connection portion (e.g., the second connection portion C3 of FIG. 5) extended from the extending portion and to be electrically connected to the second printed circuit board.

According to various embodiments, the electronic device may further include a display (e.g., the display 330 of FIG. 3) disposed in the internal space and disposed to be visible from the outside through at least a portion of the housing.

According to various embodiments, the at least one transmissive area may be formed in at least a portion of the at least one conductive layer facing the first connection portion.

According to various embodiments, an electronic device (e.g., the electronic device 300 of FIG. 3) includes a housing (e.g., the housing 110 of FIG. 1); a first printed circuit board (e.g., the printed circuit board 410 of FIG. 5) disposed in an internal space (e.g., the internal space 3001 of FIG. 4) of the housing and including a plurality of first conductive terminals (e.g., the plurality of first conductive terminals 430 of FIG. 5); a second printed circuit board (e.g., the PCB 340 of FIG. 5) spaced apart from the first printed circuit board; and a flexible circuit board (e.g., the flexible circuit board 500 of FIG. 5) including a connection portion (e.g., the connection portion C1 of FIG. 5) configured to electrically connect the first printed circuit board and the second printed circuit board and including a plurality of second conductive terminals (e.g., the plurality of second conductive terminals 511 of FIG. 5), wherein the connecting portion includes at least one transmissive area (e.g., the transmissive area E1 of FIG. 7A) formed to check at least some of the plurality of first conductive terminals and at least some of the plurality of second conductive terminals from the outside, when at least some of the plurality of first conductive terminals and at least some of the plurality of second conductive terminals overlap each other to be electrically connected.

According to various embodiments, at least some of the plurality of first conductive terminals or the plurality of second conductive terminals may be visible through the at least one transmissive area.

According to various embodiments, the plurality of first conductive terminals and the plurality of second conductive terminals may be disposed to have a pitch in a range of about 0.2 mm to 0.65 mm.

According to various embodiments, an electronic device (e.g., the electronic device 300 of FIG. 3) includes a first circuit board (e.g., the first circuit board 410 of FIG. 7A) in which at least one antenna is disposed; a second circuit board (e.g., the PCB 340 of FIG. 5) in which communication circuits (e.g., the wireless communication circuit 1511 of FIG. 15A) configured to process signals to be transmitted to or received from an external electronic device through the at least one antenna (e.g., the antenna element 420 of FIG. 5) are disposed; and a flexible circuit board (e.g., the flexible circuit board 500 of FIG. 5) connected between the first circuit board and the second circuit board, wherein the flexible circuit board includes a third conductive layer (e.g., the third conductive layer 530 of FIG. 7C) including a first ground plane electrically connected to a ground of the communication circuit; a first conductive layer (e.g., the first conductive layer 510 of FIG. 7C) including a second ground plane electrically connected to the ground; a second conductive layer (e.g., the second conductive layer 520 of FIG. 7C) disposed between the third conductive layer and the first conductive layer and including a signal wiring (e.g., the signal transfer wiring layer 5111a of FIG. 7D) electrically connected between the at least one antenna and the communication circuit; and a connection portion (e.g., the connection portion C1 of FIG. 7A) in which at least a portion of the signal wiring is formed with a plurality of conductive terminals (e.g., the plurality of conductive terminals 511 of FIG. 7A) electrically connected to the first circuit board through a conductive adhesive member (e.g., the conductive bonding 610 of FIGS. 6A-6D), and wherein the third conductive layer includes a shielding area (e.g., the first extension area 533 and the second extension area 534 of FIG. 11A) facing the connection portion and extended from the first ground plane and a transmissive area (e.g., the transmissive area E5 of FIG. 11A) in which light may be transmitted.

According to various embodiments, the plurality of conductive terminals may be disposed to have a pitch in the range of about 0.2 mm to 0.65 mm.

Although the present disclosure has been described with various embodiments, various changes and modifications may be suggested to one skilled in the art. It is intended that the present disclosure encompass such changes and modifications as fall within the scope of the appended claims.

What is claimed is:
1. An electronic device, comprising:
a housing;

a first circuit board disposed in an internal space of the housing and comprising a plurality of first conductive terminals; and a flexible circuit board comprising:
- a first connection portion comprising a plurality of second conductive terminals configured to connect to the plurality of first conductive terminals,
- a extending portion extended from the first connection portion,
- at least one conductive layer extended from the extending portion to at least a portion of the first connection portion, and
- at least one transmissive area in which light may be transmitted and in which the at least one conductive layer is at least partially omitted, and wherein at least some of the plurality of second conductive terminals are disposed to be visible from the outside through the at least one transmissive area.

2. The electronic device of claim 1, wherein:
when at least some of the plurality of first conductive terminals overlap at least some of the plurality of second conductive terminals to be electrically connected to the at least some of the plurality of second conductive terminals,
at least some of the plurality of second conductive terminals are visible through the at least one transmissive area.

3. The electronic device of claim 1, wherein:
the at least one conductive layer is disposed through an insulating material, and
the transmissive area is formed through the insulating material of a transparent material.

4. The electronic device of claim 1, wherein the at least one conductive layer comprises:
- a first conductive layer;
- a second conductive layer stacked on the first conductive layer and comprising at least one signal wiring; and
- a third conductive layer stacked on the second conductive layer,
wherein each of the at least one conductive layer is disposed to maintain a gap through an insulating material, and each of the at least one conductive layer are electrically connected to each other through conductive vias.

5. The electronic device of claim 4, wherein at least some of the plurality of second conductive terminals comprise a plurality of ground terminals extended from the extending portion to the first connection portion in the first conductive layer.

6. The electronic device of claim 4, wherein at least some of the plurality of second conductive terminals comprise at least one signal terminal electrically connected to the signal wiring through the conductive vias in the first conductive layer and configured to transfer a signal through the signal wiring.

7. The electronic device of claim 6, wherein at least some of the plurality of second conductive terminals comprise at least one signal transfer wiring layer extended to the first connection portion so as to be insulated from a peripheral ground wiring layer in the second conductive layer of the extending portion.

8. The electronic device of claim 7, wherein the at least one signal transfer wiring layer is electrically connected to the at least one signal terminal of the first conductive layer through at least one conductive via in the first connection portion.

9. The electronic device of claim 6, wherein the at least one signal terminal is disposed between a plurality of ground terminals.

10. The electronic device of claim 6, further comprising at least one extension area in which at least one of the first conductive layer and the second conductive layer is extended from the extending portion to at least a portion of the first connection portion.

11. The electronic device of claim 10, wherein the at least one extension area is disposed at a position overlapped with the signal terminal and some ground terminals around the signal terminal, when viewed from above the first connection portion.

12. The electronic device of claim 1, wherein at least one antenna element disposed at the first circuit board is disposed.

13. The electronic device of claim 12, further comprising a second printed circuit board spaced apart from the first circuit board,
wherein the flexible circuit board further comprises a second connection portion extended from the extending portion and configured to electrically connect to the second printed circuit board.

14. The electronic device of claim 1, further comprising a display disposed in the internal space and disposed to be visible from the outside through at least a portion of the housing.

15. The electronic device of claim 1, wherein the at least one transmissive area is formed in at least a portion of the at least one conductive layer facing the first connection portion.

16. An electronic device, comprising:
- a housing;
- a first printed circuit board disposed in an internal space of the housing and comprising a plurality of first conductive terminals;
- a second printed circuit board spaced apart from the first printed circuit board; and
- a flexible circuit board comprising a connection portion configured to electrically connect the first printed circuit board and the second printed circuit board, and comprising a plurality of second conductive terminals,
wherein the connecting portion comprises at least one transmissive area formed to check at least some of the plurality of first conductive terminals and at least some of the plurality of second conductive terminals from the outside, when at least some of the plurality of first conductive terminals and at least some of the plurality of second conductive terminals overlap each other to be electrically connected.

17. The electronic device of claim 16, wherein at least some of the plurality of first conductive terminals or the plurality of second conductive terminals are visible through the at least one transmissive area.

18. The electronic device of claim 16, wherein the plurality of first conductive terminals and the plurality of second conductive terminals are disposed to include a pitch between 0.2 mm to 0.65 mm.

19. An electronic device, comprising:
- a first circuit board in which at least one antenna is disposed;
- a second circuit board in which communication circuits configured to process signals to be transmitted to or received from an external electronic device through the at least one antenna are disposed; and a flexible circuit board connected between the first circuit board and the second circuit board, wherein the flexible circuit board comprises:
- a third conductive layer comprising a first ground plane electrically connected to a ground of the communication circuit;
- a first conductive layer comprising a second ground plane electrically connected to the ground;
- a second conductive layer disposed between the third conductive layer and the first conductive layer and comprising a signal wiring electrically connected between the at least one antenna and the communication circuit; and
- a connection portion in which at least a portion of the signal wiring is formed with a plurality of conductive terminals electrically connected to the first circuit board through a conductive adhesive member,
- wherein the third conductive layer comprises a shielding area facing the connection portion and extended from the first ground plane and a transmissive area in which light may be transmitted.

20. The electronic device of claim 19, wherein the plurality of conductive terminals are disposed to include a pitch in between 0.2 mm to 0.65 mm.

* * * * *